United States Patent
Patra et al.

(10) Patent No.: US 9,645,501 B2
(45) Date of Patent: May 9, 2017

(54) ILLUMINATION OPTICAL UNIT FOR EUV PROJECTION LITHOGRAPHY, AND OPTICAL SYSTEM COMPRISING SUCH AN ILLUMINATION OPTICAL UNIT

(71) Applicant: Carl Zeiss SMT GmbH, Oberkochen (DE)

(72) Inventors: Michael Patra, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 294 days.

(21) Appl. No.: 14/467,418

(22) Filed: Aug. 25, 2014

(65) Prior Publication Data

US 2014/0368803 A1 Dec. 18, 2014

Related U.S. Application Data

(63) Continuation of application No. PCT/EP2013/054233, filed on Mar. 4, 2013.
(Continued)

(30) Foreign Application Priority Data

Mar. 9, 2012 (DE) .......................... 10 2012 203 716
Oct. 4, 2012 (DE) .......................... 10 2012 218 076

(51) Int. Cl.
*G03B 27/54* (2006.01)
*G03F 7/20* (2006.01)
(Continued)

(52) U.S. Cl.
CPC .......... *G03F 7/7015* (2013.01); *G02B 5/0891* (2013.01); *G02B 5/09* (2013.01);
(Continued)

(58) Field of Classification Search
CPC .......................... G03F 7/7015; G03F 7/70075
(Continued)

(56) References Cited

U.S. PATENT DOCUMENTS 5,896,438 A 4/1999 Miyake et al.
6,069,739 A 5/2000 Borodovsky et al.
(Continued)

FOREIGN PATENT DOCUMENTS

CN 101 013 267 A 8/2007
CN 101 946 190 A 1/2011
(Continued)

OTHER PUBLICATIONS

B. Kostka et al., "Ein supraleitender Undulator mit elektrisch umschaltbarer Helizität" ["A Superconducting Undulator having Electrically Switchable Helicity"], Superconductive Undulators With Variable Polarization Direction, Research Center Karlsruhe, Germany, Scientific Reports, FZKA 6997, Aug. 2004.
(Continued)

*Primary Examiner* — Hung Henry Nguyen
(74) *Attorney, Agent, or Firm* — Fish & Richardson P.C.

(57) ABSTRACT

An illumination optical unit for EUV projection lithography guides illumination light to an illumination field, in which a lithography mask can be arranged. A facet mirror with a plurality of facets guides the illumination light to the illumination field. Respectively one illumination channel which guides an illumination light partial beam is predetermined by one of the facets. Exactly one illumination channel is guided over respectively one of the facets. The illumination optical unit is configured so that, at any time and at any point in the illumination field when the illumination optical unit is in operation, any pairs of illumination light partial beams guided over different illumination channels are incident on this illumination field point at times of incidence, the time
(Continued)

difference of which is greater than a coherence duration of the illumination light.

20 Claims, 22 Drawing Sheets

Related U.S. Application Data

(60) Provisional application No. 61/608,685, filed on Mar. 9, 2012, provisional application No. 61/709,510, filed on Oct. 4, 2012.

(51) Int. Cl.

| | | |
|---|---|---|
| *G02B 5/09* | (2006.01) | |
| *G02B 27/48* | (2006.01) | |
| *G02B 27/09* | (2006.01) | |
| *G02B 5/08* | (2006.01) | |
| *H05G 2/00* | (2006.01) | |

(52) U.S. Cl.
CPC ..... *G02B 27/0927* (2013.01); *G02B 27/0933* (2013.01); *G02B 27/0977* (2013.01); *G02B 27/48* (2013.01); *G03F 7/70075* (2013.01); *G03F 7/70583* (2013.01); *H05G 2/008* (2013.01)

(58) Field of Classification Search
USPC .......................................... 355/53, 55, 67–71
See application file for complete search history.

(56) References Cited

U.S. PATENT DOCUMENTS

| | | | |
|---|---|---|---|
| 6,570,168 B1 | 5/2003 | Schultz et al. | |
| 6,573,978 B1 | 6/2003 | McGuire | |
| 6,587,182 B1* | 7/2003 | Goto | G03F 7/70583 355/53 |
| 6,597,430 B1* | 7/2003 | Nishi | G03F 7/70583 355/53 |
| 6,859,515 B2 | 2/2005 | Schultz et al. | |
| 6,977,718 B1 | 12/2005 | LaFontaine | |
| 8,174,677 B2 | 5/2012 | Ossmann et al. | |
| 2003/0043359 A1 | 3/2003 | Naulleau | |
| 2005/0146702 A1 | 7/2005 | Eurlings et al. | |
| 2006/0132747 A1 | 6/2006 | Singer et al. | |
| 2006/0158288 A1 | 7/2006 | Rossmanith et al. | |
| 2007/0247606 A1 | 10/2007 | Visser et al. | |
| 2007/0295919 A1 | 12/2007 | Endres et al. | |
| 2008/0013680 A1 | 1/2008 | Singer et al. | |
| 2011/0001947 A1* | 1/2011 | Dinger | G02B 26/06 355/67 |
| 2011/0014799 A1 | 1/2011 | Singer et al. | |
| 2011/0228244 A1 | 9/2011 | Mann | |
| 2012/0327503 A1* | 12/2012 | Manassen | G01J 1/4257 359/291 |
| 2016/0313646 A1 | 10/2016 | Dinger et al. | |

FOREIGN PATENT DOCUMENTS

| | | |
|---|---|---|
| DE | 103 58 225 B3 | 12/2003 |
| DE | 103 45 430 A1 | 6/2005 |
| DE | 10 2008 000 967 A1 | 10/2009 |
| DE | 10 2008 021 833 B4 | 4/2010 |
| EP | 1 072 957 A2 | 1/2001 |
| EP | 1 225 481 A2 | 7/2002 |
| EP | 1 521 111 A1 | 4/2005 |
| EP | 1 793 278 A2 | 6/2007 |
| EP | 1 451 629 B1 | 7/2008 |
| EP | 1 614 008 B1 | 12/2009 |
| JP | H 10 125585 A | 5/1998 |
| JP | 2000-277421 A | 10/2000 |
| JP | 2005-136422 A | 5/2005 |
| JP | 2007-179039 A | 7/2007 |
| JP | 2010-046135 A | 3/2010 |
| JP | 2011-512659 A | 4/2011 |
| WO | WO 2000/070660 A | 11/2000 |
| WO | WO 03/048839 A1 | 6/2003 |
| WO | WO 2009/100856 A1 | 8/2009 |
| WO | WO 2009/121438 A1 | 10/2009 |
| WO | WO 2010/099807 A | 9/2010 |

OTHER PUBLICATIONS

German Examination Report, with translation thereof, for corresponding DE Appl. No. 10 2012 218 076.1, dated May 28, 2013.
German Examination Report, with translation thereof, for corresponding DE Appl. No. 10 2012 203 716.0, dated Oct. 31, 2012.
Chinese office action with English translation with respect to Chinese patent application No. 2013 8002 1048.4, dated Nov. 2, 2015.
Chinese office action, with English translation thereto, for CN Appl No. 2013 8002 1048.4, dated Jun. 14, 2016.
Joseph W. Goodman, "Speckle Phenomena in Optics," Roberts & Company, 2010, pp. 1-53.
International Search Report for Appl No. PCT/EP2013/054233, dated Jul. 16, 2003.
Chinese office action, with English translation thereof, for corresponding CN Appl No. 2013 8002 1048.4, dated Nov. 28, 2016.
Japanese office action, with English translation thereof, for corresponding JP Appl No. 2014-560 317, dated Oct. 31, 2016.

* cited by examiner

ILLUMINATION OPTICAL UNIT FOR EUV PROJECTION LITHOGRAPHY, AND OPTICAL SYSTEM COMPRISING SUCH AN ILLUMINATION OPTICAL UNIT

CROSS-REFERENCE TO RELATED APPLICATIONS

The present application is a continuation of, and claims benefit under 35 USC 120 to, international application PCT/EP2013/054233, filed Mar. 4, 2013, which claims benefit under 35 USC 119 of German Application Nos. 10 2012 203 716.0, filed Mar. 9, 2012 and 10 2012 218 076.1, filed Oct. 4, 2012. International application PCT/EP2013/054233 also claims priority under 35 USC 119(e) to U.S. Provisional Application Nos. 61/608,685, filed Mar. 9, 2012 and 61/709,510, filed Oct. 4, 2012. The entire disclosure of each of these applications is incorporated by reference herein.

The invention relates to an illumination optical unit for EUV projection lithography. Furthermore, the invention relates to an optical system comprising such an illumination optical unit, an illumination system comprising such an optical system, a projection exposure apparatus comprising such an illumination system, a method for projection exposure for producing a microstructured or nanostructured component, in particular a semiconductor chip, with the aid of the projection exposure apparatus, and a microstructured or nanostructured component produced by this method.

Illumination optical units for projection lithography are known from EP 1 451 629 B1 and U.S. Pat. No. 6,069,739. EP 1 521 111 A1 and DE 103 45 430 A1 have disclosed an illumination system with a coherence reducer. The latter is embodied as an arrangement of crossed stepped mirrors, wherein each one of the mirror steps guides a plurality of illumination channels.

A projection exposure apparatus with an illumination system is known from WO 2009/121 438 A1. An EUV light source is known from DE 103 58 225 B3. Further citations, from which an EUV light source is known, are found in WO 2009/121 438 A1. EUV illumination optical units are furthermore known from US 2003/0043359 A1 and U.S. Pat. No. 5,896,438.

Furthermore, an illumination optical unit for projection lithography is known from US 2007/0295919 A1 and WO 03/048 839 A1.

It is an object of the present invention to develop an illumination optical unit of the type set forth at the outset in such a way that a quality of the illumination of the illumination field is improved.

According to the invention, this object is achieved by an illumination optical unit for EUV projection lithography, for guiding illumination light to an illumination field, in which a lithography mask can be arranged. The illumination optical unit comprises a facet mirror with a plurality of facets for guiding the illumination light to the illumination field. Respectively one illumination channel which guides an illumination light partial beam is predetermined by one of the facets. Exactly one illumination channel is guided over respectively one of the facets. The illumination optical unit is embodied in such a way that, when the illumination optical unit is in operation, any pairs of illumination light partial beams guided over different illumination channels which are incident simultaneously at the same point in the illumination field have a mutual travel time difference which is greater than a coherence duration $\tau_K$ of the illumination light.

The illumination optical unit may be an illumination optical unit for EUV projection lithography. The longitudinal coherence length, abbreviated to coherence length in the following, depends on the used spectral bandwidth of the illumination light. A coherence time is equivalent to a coherence length; conversion between the two can be performed using the speed of light. If the illumination optical unit carries out spectral filtering of the illumination light, the relevant bandwidth is the spectral bandwidth of the illumination light arriving in the illumination field, and not the spectral bandwidth at the light source. By way of example, coherence lengths can lie in the region of 10 μm. Longer coherence lengths are also possible, depending on the type of light source used.

What was identified according to the invention was that interference problems between partial beams of the illumination light, which are superposed in the illumination field, occur precisely when at least two partial beams of illumination light are incident on any point of the illumination field at any time and, in the process, the optical path lengths measured from the light source between at least two of these partial beams differ by less than the coherence length of the illumination light. An embodiment two paragraphs above the present paragraph prevents the conditions for unwanted interference from being satisfied and therefore prevents the possibility of interference problems occurring. The specified condition that the mutual travel time differences of any pairs of illumination light partial beams guided over different illumination channels is greater than a coherence duration of the illumination light applies to each point in the illumination field.

To this end, each one of the illumination channels is initially defined exactly by an assignment of the facets to exactly one illumination channel in each case. The different illumination channels in general overlap somewhere in space, but are spatially separated on a facet mirror. Thus, one and the same facet guides the illumination light of exactly one illumination channel. Therefore, illumination light which is guided over exactly one illumination channel is not simultaneously incident on a plurality of facets on the facet mirror. Illumination channels are uniquely defined in this manner. The partial beams of the illumination light are created by reflections on faceted optical elements in the beam path and propagate within the corresponding illumination channels.

The facet mirror can be a field facet mirror, the field facets of which are imaged superposing one another in the illumination field. Alternatively, the facet mirror can also be a specular reflector. A specular reflector is known from US 2006/0132747 A1, EP 1 614 008 B1 and U.S. Pat. No. 6,573,978. The illumination channels of the illumination light partial beams can be followed through the illumination optical unit from a light source for the illumination light to the illumination field. For the considered travel time differences, only that part of the illumination channels, in which these illumination light partial beams are separated from one another in the illumination optical unit, is relevant. Instead of considering all of the illumination channels from the light source, it is possible to consider the illumination channels from e.g. the input of a beam guidance in the illumination optical unit.

The illumination optical unit can include an additional facet mirror arranged downstream of the first facet mirror in the beam path of the illumination light. The additional facet mirror can comprise a plurality of second facets, wherein the first and second facets are arranged in such a way that respectively one illumination channel, which guides an illumination light partial beam, is predetermined by a first facet and an associated second facet, wherein exactly one illumination channel is guided over respectively one of the facets. Such an embodiment was found to be particularly suitable for predetermining an illumination to be set. The first facet mirror can be arranged in the region of a field plane of the illumination optical unit. The second facet mirror can be arranged in the region of a pupil plane of the illumination optical unit. The facets of the at least one facet mirror can in turn be subdivided into individual mirrors. By way of example, such an individual mirror subdivision is known from US 2011/001 947 A1. Certain realizations of such individual mirror arrangements are also referred to as micro-electromechanical systems (MEMS).

The optical path length difference between the various illumination partial beams emerges, in particular, from the geometric arrangement of the illumination channels. In an embodiment in which travel time differences emerge between the illumination light partial beams dependent on the differences in the path lengths of beam paths of the illumination channels, the selection and arrangement of the illumination channels ensures that the path length differences along the illumination channels are always long enough such that the condition specified above for unwanted interferences cannot be satisfied. In such an embodiment, a retardation which is longer than a coherence duration of the illumination light is brought about, within the illumination optical unit, between illumination light components, in particular illumination light pulses, arriving in the illumination field over time.

Such a time retardation corresponds to an optical path length difference to be set between the partial beams or between the illumination channels and emerges from the geometry of the illumination channels. The time retardation between any pair of partial beams is longer than the coherence duration of the illumination light, and so a minimum travel time difference between the illumination channel with the shortest path length and the illumination channel with the longest path length, measured between a light source for the illumination light and the illumination field, emerges which at least equals the product of the illumination channel number and the coherence time of the light source.

The regularity of the illumination of the illumination field emerging when taking into account this path length difference condition often is insufficient. The regularity describes how strongly the dose, which contributes to illuminating a point, an object to be illuminated or an image of this object, varies as a function of the location in an illumination field or in an object field or image field. In the context of projection lithography, the regularity is also referred to as uniformity. The regularity can be quantified in two alternative ways, namely either by a maximum deviation of an illumination dose or by a variance, in particular by a relative variance, of the illumination dose as a function of the field location.

In the illumination optical unit according to described in the paragraph three paragraphs above the present paragraph, the travel time differences between the illumination light partial beams are predetermined in such a way that, at any time and at any point in the illumination field when the illumination optical unit is in operation, any pairs of illumination light partial beams guided over different illumination channels at least have an optical path length difference from one another which is longer than a coherence length of the illumination light.

A regularity of the illumination of the illumination field, which emerges when taking into account the travel time or path length difference condition specified above, is additionally improved with the aid of the optical retardation component for dividing at least one illumination light partial beam into a plurality of partial beam components, wherein the partial beam components have such pairwise travel time differences amongst themselves that each difference between the travel times of the partial beam components of any illumination light partial beams, measured between a location in the beam path of the illumination light, which lies both upstream of the division thereof into the illumination light partial beams and upstream of the retardation component, and the illumination field, still is greater than the coherence duration ($\tau_K$) of the illumination light. Such an embodiment can be implemented without an intervention in the other geometry of the illumination channels being necessary. The retardation component generates a plurality of light beams retarded with respect to one another, which are also referred to as partial beams or beam components, from an incident light beam. Illumination light partial beams generated by the reflection of the faceted optical elements in the beam path can be retarded with respect to one another in respect of their travel time via the optical retardation component. Alternatively or additionally, it is possible to divide the partial beams themselves, generated by the facet reflections, into partial beam components with the aid of the optical retardation component, which partial beam components in turn have a pairwise travel time difference with respect to one another. Each one of these retarded light beams improves the regularity of the illumination of the illumination field. The embodiment described in the present paragraph ensures that no unwanted interference may occur.

The optical retardation component can be configured in such a way that all pairwise travel time differences of the partial beam components of the at least one illumination light partial beam are longer than the maximum travel time difference of two illumination light partial beams, measured between a location in the beam path of the illumination light prior to the division thereof into the illumination light partial beams and the illumination field. The optical retardation component can also be configured in such a way that all pairwise travel time differences of the partial beam components of the at least one illumination light partial beam are shorter than the minimum travel time difference between two different illumination light partial beams, measured between a location in the beam path of the illumination light prior to the division thereof into the illumination light partial beams and the illumination field. These variants of the illumination optical unit enable different temporal mixing of illumination channel part light pulses of the illumination light and differ in terms of travel time differences which are impressed by a retardation component according to preceding paragraph. Particularly advantageous variants have a particularly small step height or a particularly large step height, while average step heights tend to be disadvantageous. The length scales for the step heights are influenced by the coherence length of the illumination light. In this case, particularly small step heights are less than 50 μm, in particular less than 20 μm, in particular less than 10 μm, in particular less than 5 μm, in particular less than 2 μm and in particular less than 1 μm. Particularly large step heights are greater than 250 μm, in particular greater than 1 mm, in particular greater than 5 mm and in particular greater than 20 mm.

The optical retardation component can be embodied as a reflecting stepped mirror for dividing at least one illumination light partial beam into a plurality of partial beam components, which reflecting stepped mirror deflects the incident at least one illumination light partial beam into reflecting partial beam components with pairwise travel time differences, wherein the components are predetermined by different steps of the stepped mirror. Such a reflecting stepped mirror is an optical retardation component which can be produced with sufficient accuracy. In particular, the illumination light can impinge upon the optical retardation component with small angles of incidence, i.e. in the region of perpendicular incidence, for example with angles of incidence which are less than 30°, which are less than 25°, which are less than 20°, which are less than 15° or which are less than 10°, such that a high degree of reflection is obtained, even in the case of a reflection of EUV light. In principle, the optical retardation component can also be embodied as reflected stepped mirror operated under grazing incidence, i.e. with angles of incidence which are greater than 60°, which are greater than 65°, which are greater than 70°, which are greater than 75° or which are greater than 80°. The optical retardation component may comprise a multilayer coating for optimizing the degree of reflection for the EUV wavelength to be reflected.

The travel time differences of the partial beam components can be predetermined by step heights of the stepped mirror. Typical retardation paths, which are impressed by the steps of the stepped mirror, lie in the region of a few μm, for example in the region of 1 μm, 2 μm, 5 μm, 10 μm. Relatively large path differences in the region of several 10 μm, e.g. in the region of 25 μm, 50 μm, 75 μm, in the region of 100 μm, of 250 μm, 500 μm or else in the millimeter range, e.g. in the region of 1 mm, 2 mm, 5 mm or even longer path differences are also possible. The retardation paths can be tuned to the coherence length of the light source which provides the illumination light.

The optical retardation component can be formed at the location of the first or of the second facet mirror. Such an embodiment of the optical retardation component can avoid an additional reflection. In particular, the retardation component can be formed at the location of the second facet mirror. In this case, the facets themselves are embodied as optical retardation components. The optical retardation component can, in general, be arranged in the region of a pupil plane of the illumination optical unit. In this case, the retardation travel time difference, which is impressed on the illumination light by the optical retardation component, acts over the whole illumination field. Alternatively, the optical retardation component can also be arranged in the region of a field plane of the illumination optical unit.

The optical path length between light source and illumination field along an illumination channel depends systematically on the considered illumination field point. Hence, if two specific illumination channels are considered, an optical path length difference between these two illumination channels for a first illumination field point is, in general, different to that for an illumination field point at a distance herefrom. What was identified is that this dependence makes finding a geometric arrangement of the illumination channels, in which the condition for unwanted interference is not satisfied anywhere on the illumination field, more difficult. If two illumination channels have a different dependence of the optical path length on the illumination field point, it is often necessary for the difference, in terms of magnitude, of the two optical path lengths at most illumination field points to be orders of magnitude larger than the coherence length of the illumination light so as also to be able to achieve a difference of at least the coherence length of the illumination light at the illumination field point with the smallest difference, in terms of magnitude, of the optical path lengths over these two illumination channels. Geometric realization options for such large path length differences are provided with disadvantages, and so a configuration of the illumination optical unit, in which the correspondingly large path length differences need not be realized in order to achieve an optical path length difference of at least the coherence length of the illumination light for each illumination field point, is advantageous.

In some embodiments, the first facet mirror is embodied as field facet mirror and the second facet mirror is embodied as pupil facet mirror. The illumination optical unit also comprises a transmission optical unit for superposing imaging of the field facets in the illumination field, which transmission optical unit comprises the pupil facet mirror, arranged downstream of the field facet mirror. The pupil facet mirror comprises a plurality of pupil facets for reflecting respectively one of the partial beams of the illumination light. The illumination optical unit can be arranged in such a way that images of the illumination light source come to rest at the location of the pupil facets of the pupil facet mirror. The pupil facet mirror is arranged with such a tilt that the various illumination channels, by which each one of the field points of the illumination field can be impinged upon by the partial beams of the illumination light, respectively have different illumination channel lengths between the light source and respectively one of the field points of the illumination field. Such tilting of the pupil facet mirror makes it easier to take into account this systematic dependence of the optical path length on the illumination field point. As soon as the condition specified above for unwanted interference is not satisfied for one illumination field point, it is not satisfied either for a large part of the whole illumination field.

There can be such a tilt of the pupil facet mirror in the embodiments of the preceding paragraph that no light path between any pair of pupil facets and a respectively considered illumination field point has an identical length. Disturbing interference of the illumination light in the illumination field is avoided. What is ensured for each field point of the illumination field is that it is illuminated via different light path lengths provided that it is illuminated by the light source via different illumination channels.

A normal on a main mirror surface of the pupil facet mirror can be arranged with a tilt of at least 2° with respect to a plane of incidence of the illumination light partial beams on a main mirror surface of the field facet mirror. Such a tilt angle was found to be suitable for avoiding disturbing interference. The tilt angle may be 3°, 4°, 5°, 7° or 10°. The plane of incidence of the illumination light partial beams on a main mirror surface of the field facet mirror is defined by the plane of incidence of a centroid ray of the illumination light on the main mirror surface of the field facet mirror, i.e. on that plane on which the facets of the field facet mirror are arranged.

In an alternative or additional possible arrangement variant, the first facet mirror is embodied as field facet mirror and the second facet mirror is embodied as pupil facet mirror. The imaging optical unit also comprises a transmission optical unit for superposing imaging of the field facets in the illumination field, which transmission optical unit comprises the pupil facet mirror, arranged downstream of the field facet mirror. The pupil facet mirror comprises a plurality of pupil facets for reflecting respectively one of the partial beams of the illumination light. The illumination optical unit can be arranged in such a way that images of the illumination light source come to rest at the location of the pupil facets of the pupil facet mirror. A main mirror surface of the pupil facet mirror deviates from a plane reference surface in such a way that the various illumination channels, by which each one of the field points of the illumination field can be impinged upon by the partial beams of the illumination light, respectively have different illumination channel lengths between the light source and respectively one of the field points of the illumination field. In such an embodiment, a path length difference between the various illumination channel lengths which avoids disturbing interference in the illumination image is likewise achieved. Here, at least part of the systematic dependence of the optical path length along an illumination channel is compensated for by a suitable form of the pupil facet mirror.

A main mirror surface of the pupil facet mirror may be parabolically curved. Such a parabolic curve of the main mirror surface of the pupil facet mirror can be realized with comparatively little complexity from a production-technical point of view.

An embodiment can further include a scanning device, which scans an illumination beam, the whole beam cross-section of which when incident on the facet mirror is greater than 20% of a reflection surface of one of the facets, over the facets of the facet mirror in such a way that the illumination light illuminates the illumination field. The scanning device is embodied in such a way that at any given time respectively one field point in the illumination field is only illuminated via at most one of the facets in each case. Such an embodiment ensures that the condition for disturbing interference is never satisfied by virtue of a scanning device ensuring that, at any one time, each point of the illumination field is only impinged upon by illumination light along at most one illumination channel and hence that no two illumination light partial beams can interfere. This is achieved by virtue of only a small region of the first facet mirror also being illuminated via a scanning device at any one time. What was identified is that this requires the overall area of the region illuminated on the first facet mirror at one instance being sufficiently smaller than the area of a field facet, wherein, however, the illuminated region may partially cover a plurality of field facets as long as only the overall area of the beam cross-section is small enough.

When impinging on the facet mirror, the beam cross-section of the illumination beam according to the embodiment of the preceding paragraph has a dimension which is greater than one fifth of a reflection surface of one of the field facets, which therefore, at best, is smaller than the reflection surface of one of the field facets by less than one order of magnitude. This ratio can apply to all field facets of the field facet mirror. The illumination system can be embodied in such a way that the overall beam cross section of the illumination beam when impinging on the facet mirror is greater than 30%, is greater than 33%, is greater than 35%, is greater than 40%, is greater than 50%, is greater than 60%, is greater than 75% or is greater than 80% of a reflection surface of one of the field facets. This order of magnitude of the beam cross section when impinging on the facet mirror avoids a region of the illumination field which is too small being illuminated at a given time. This leads to a stable illumination system.

The facet mirror can be a field facet mirror which is arranged in a plane optically conjugate to the arrangement plane of the illumination field.

The scanning device can be embodied in such a way that in each case at least one continuous scanning region is scanned on the facet mirror in sequence, the scanning region area of which scanning region at most corresponding to the area of one of the facets. In such an embodiment, the facets of the field facet mirror themselves can be scanned individually or it is possible to scan continuous scanning regions between adjacent, adjoining facets, the scanning region area of which scanning regions at most corresponds to the area of one of the facets. The bounding shape of the respective scanning region, which scanning region, during sequential scanning of the facet mirror, is then scanned over the latter, can be exactly the bounding shape of an individual facet of the facet mirror. Alternatively, the bounding shape can also be written into the bounding shape of an individual facet of the facet mirror. The scanning device can be embodied in such a way that the individual scanning regions, which are scanned in sequence, are in turn illuminated by scanning. Alternatively, the scanning device can be embodied in such a way that the scanning regions are illuminated at least in sections or else completely at the same time by a correspondingly widened illumination light beam. During sequential scanning of the at least one continuous scanning region, this scanning region is displaced over the facet mirror via the scanning device in such a way that, after completion of a complete scanning process, the whole facet mirror is illuminated. Here, the at least one scanning region can be displaced continuously on the facet mirror or discontinuously on the facet mirror. The scanning region area or, to the extent that a plurality of scanning regions are scanned simultaneously, the overall area of all scanning regions may have the dimensions of at least one third of the area of one of the facets.

The scanning region area can be less than the area of one of the facets by at least the ratio of, firstly, a maximum original image displacement of an object point of the illumination field on the facets and, secondly, a facet extent parallel hereto. What is ensured in the case of such an illumination optical unit is that differences in the imaging of the various facets of the facet mirror into the illumination field do not have such an effect that disturbing interferences between sub-beams of the illumination light emerge as a result of these differences. An extent of the scanning region area, in particular along an object displacement direction, along which the object is displaced through the illumination field during the projection exposure, can be less than an extent of the facets parallel hereto.

A bounding shape of the scanning region area can correspond to a bounding shape of the respective facet. In such an embodiment, the condition according to which in each case at most one of the facets of the facet mirror respectively illuminates a field point of the illumination field can easily be satisfied. The bounding shape of the scanning region area can be embodied to be slightly smaller than the bounding shape of the respective facet such that the scanning region is slightly smaller than a used reflection surface on the facet. This increases the certainty that respectively one field point in the illumination field is only illuminated by in each case at most one of the facets.

In an alternative embodiment the scanning device is embodied in such a way that a scanning region which extends over a plurality of facets is scanned on the facet mirror. Such an embodiment simplifies the scanning movement.

The scanning region extending over a plurality of facets can be a continuous region. Such a configuration enables a continuous operation of the scanning device, during which there is no need to jump between non-continuous regions when scanning the facet mirror.

The facets of the facet mirror can be arranged column-by-column. The scanning region can be a strip extending obliquely over the facets columns. Such a configuration of the scanning region was found to be particularly suitable.

A plurality of scanning regions can be scanned simultaneously. Such an embodiment avoids a simultaneous load on an individual facet which is too high.

An offset of the scanning region between two facets adjacent column-by-column can be greater by at least one maximum original image displacement than an extent of the scanning region in the direction of the offset. Such an offset likewise avoids the risk of disturbing sub-beam or partial beam interference caused by the image.

In an embodiment, the illumination optical unit comprises a scanning device which scans an illumination beam, the whole beam cross-section of which when incident on the facet mirror is greater than 200% of a reflection surface of one of the facets, over the facets of the facet mirror in such a way that the illumination light illuminates the illumination field. The scanning device is embodied in such a way that at any given time respectively one field point in the illumination field is only illuminated by facets in which the optical path length difference respectively differs by at least one coherence length. In such an embodiment, use can be made of a facet mirror which simultaneously serves as an optical retardation component within the meaning of what was already discussed before. The facet mirror can be subdivided into a plurality of facet columns which are arranged offset to one another in such a way that the illumination light partial beams, which are guided to different facets columns via illumination channels, do not have disturbing interference due to there then being a sufficiently large path length difference.

In an embodiment of the illumination optical unit, the illumination channel pairs, in which illumination light guided along these is incident at at least one point of the illumination field in such a way that the time difference is shorter than a coherence duration ($\tau_K$) of the illumination light, a cross-sectional area of at least one of the illumination channels of these illumination channel pairs does not contribute to illuminating the illumination field. In such an embodiment, an interference is avoided by virtue of the fact that those components of an illumination channel, and hence of the illumination light partial beam guided over this illumination channel, which could contribute to disturbing interference at an object field point are suppressed such that they do not contribute to illuminating the illumination field. Such suppression can be brought about by virtue of the illumination light partial beams being blocked in the cross-sectional area of the illumination channel of interest when guided over the respective illumination channel. To this end, at least one of the facets, which defines the respective illumination channel, can comprise a reflection surface with at least one correspondingly arranged blocking region. In order to avoid interference, provision can also be made for a plurality or a multiplicity of such blocking regions on respectively one facet. By way of example, the respective blocking region can be realized by an absorbent or scattering coating, or by a stop. It is also simply possible to omit a highly reflecting coating for the illumination light in the blocking region. Surprisingly, it was found that, despite the multiplicity of possible pairs of illumination channels that emerge when a relatively large number of facets are used, only a comparatively small portion of the cross-sectional areas of the illumination channels need to be suppressed in order to avoid disturbing partial beam interferences. A loss of illumination light occurring as a result of blocking these cross-sectional areas may be less than 10%, may be less than 5% and may be less than 3%. Since there is no difference whether a cross-sectional area of one illumination channel or of the other illumination channel of this illumination channel pair is suppressed in the case of disturbing partial beam interference between the partial beams of an illumination channel pair, it is possible to select that cross-sectional area with the lower integral illumination light intensity, which further reduces the light loss.

To the extent that the at least one facet mirror is embodied from a plurality or multiplicity of individual mirrors or micromirrors, it is also possible for appropriate components, which suppress the illumination via the illumination channels in the desired cross-sectional area in order to avoid interference, to be realized by micromirrors which are tilted in such a way that the illumination light is dimmed by the corresponding micromirrors, i.e. does not contribute to illuminating the illumination field. This is advantageous, in particular in the case of a MEMS (micro-electromechanical system) embodiment of the at least one facet mirror.

The advantages of an optical system including an illumination optical unit described herein and of an optical system in which, in addition to the illumination optical unit, provision is also made for a projection optical unit for imaging an object field, which is arranged in the illumination field, into an image field correspond to those which were already explained above with reference to the illumination optical unit according to the invention. EUV light sources have a short coherence time, and so the illumination optical unit according to the invention can be realized in a compact manner. A free electron laser (FEL) can be employed as EUV light source. If there is unwanted interference, the interference can be developed more strongly if the light source comprises a small number of modes. As a result of the small mode number of an FEL, the advantages of avoiding disturbing partial beam interference are particularly pronounced there.

The EUV light source can be a free electron laser with less than ten transversal modes. An upper limit for the number of transversal modes can be derived from the etendue. In particular, the etendue of the light source can be less than $1 \times 10^{-3}$ mm², can be less than $1 \times 10^{-4}$ mm², can be less than $1 \times 10^{-5}$ mm² or else can be less than $1 \times 10^{-6}$ mm². In respect of the definition and the calculation of the etendue, reference is made to EP 1 072 957 A2. The measures according to the invention for bringing about a regularity of the illumination of an illumination field are particularly suitable for such light sources. In particular, it is possible to achieve a reduction of speckle. Other types of EUV light sources can also be used. The optical retardation component can be embodied depending on the coherence duration of the individual light source. What applies here is that an illumination optical unit with travel time differences between the illumination light partial beams embodied for a light source with a long coherence duration can also be used for a light source with a shorter coherence duration.

An intermediate focus can be arranged between the light source and the first facet mirror. The optical retardation component mentioned above can be formed at the location of the intermediate focus. Such an arrangement of the optical retardation component at the location of an intermediate focus of the optical system enables the impression of an additional retardation travel time difference by the optical retardation component, which acts in the same manner over the entire illumination field. This also applies to other arrangement locations of the optical retardation component, to the extent that these arrangement locations are present in the region of a pupil plane of the illumination optical unit.

The advantages of a projection exposure apparatus according including an optical system with an illumination optical unit described herein, of a production method comprising using such a projection exposure apparatus and of a component made by such a production method correspond to those which were already explained above with reference to the illumination optical unit according to the invention and the optical system according to the invention. The microstructured and nanostructured component can be produced with an extremely high structure resolution. In this manner, it is possible, for example, to produce a semiconductor chip with an extremely high integration or storage density.

Exemplary embodiments of the invention will be explained in more detail below on the basis of the drawing. In detail:

FIG. 1 schematically shows a meridional section through a projection exposure apparatus for EUV projection lithography;

FIG. 2 very schematically shows a beam path of a total of six illumination channels for illumination light partial beams for illuminating an illumination field, in which a lithography mask can be arranged, in a further embodiment of a projection exposure apparatus;

Figure 12:
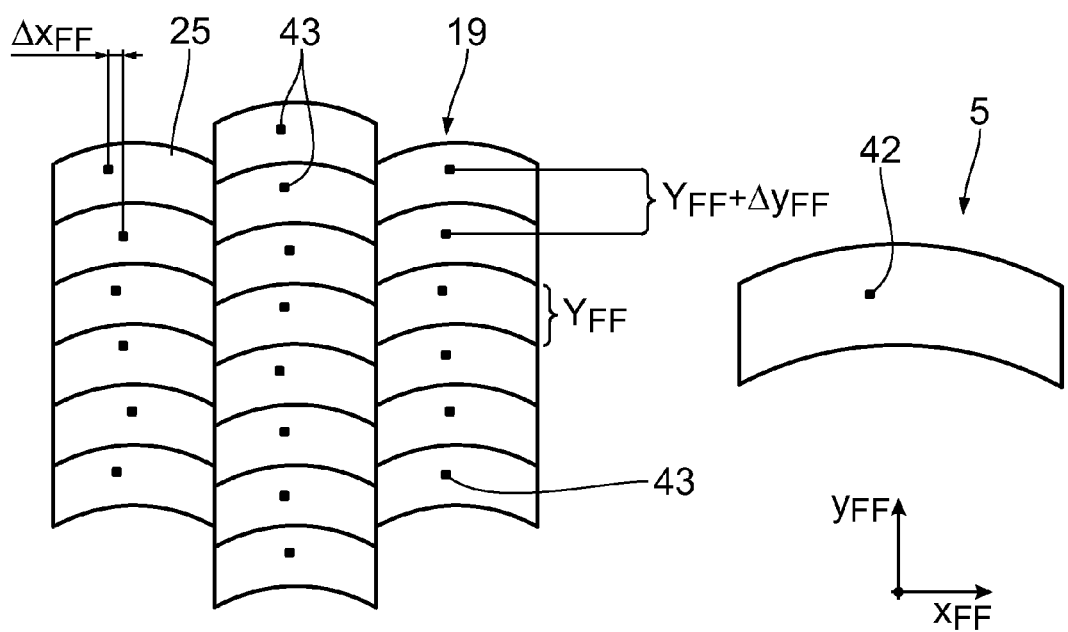
FIG. 12 shows a plan view of a further embodiment of a field facet mirror and of an illumination field, wherein one field point is highlighted in the illumination field and wherein those associated points, which are imaged on the highlighted illumination field point, on facets of the field facet mirror are also highlighted.
Figure 13:
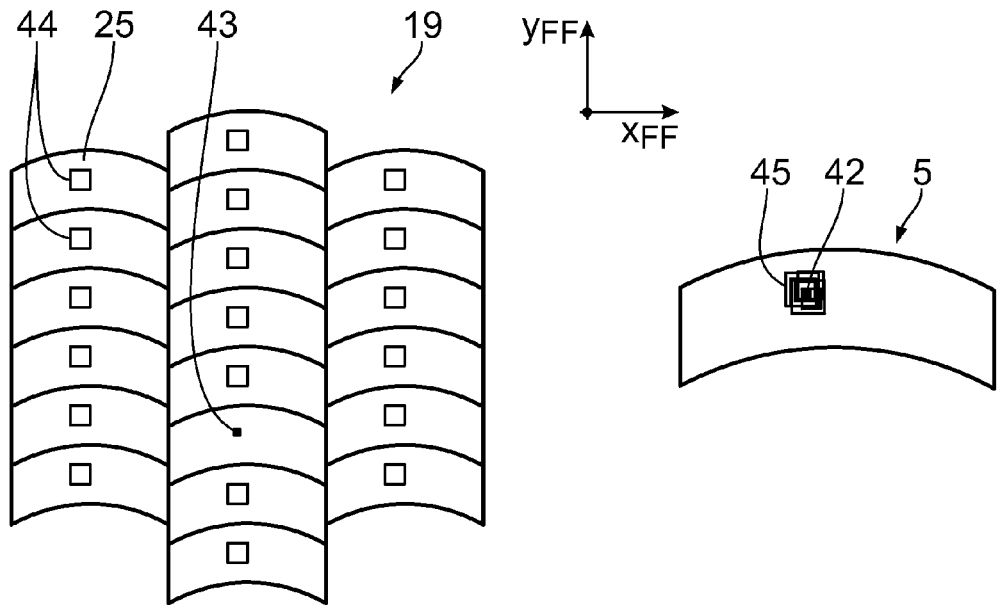
Figure 14:
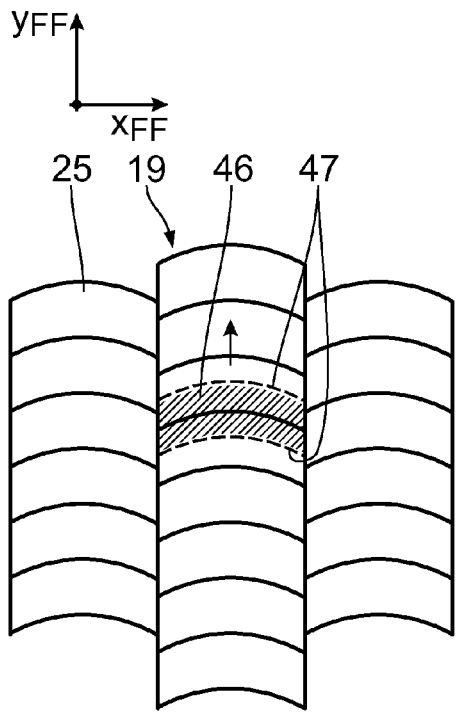
Figure 15:
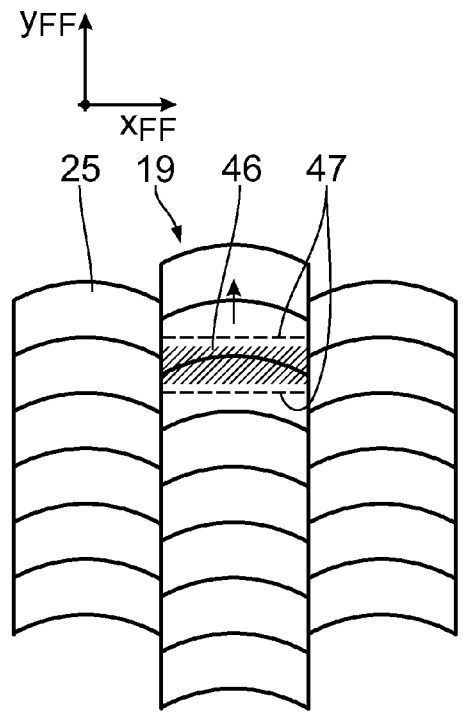
Figure 16:
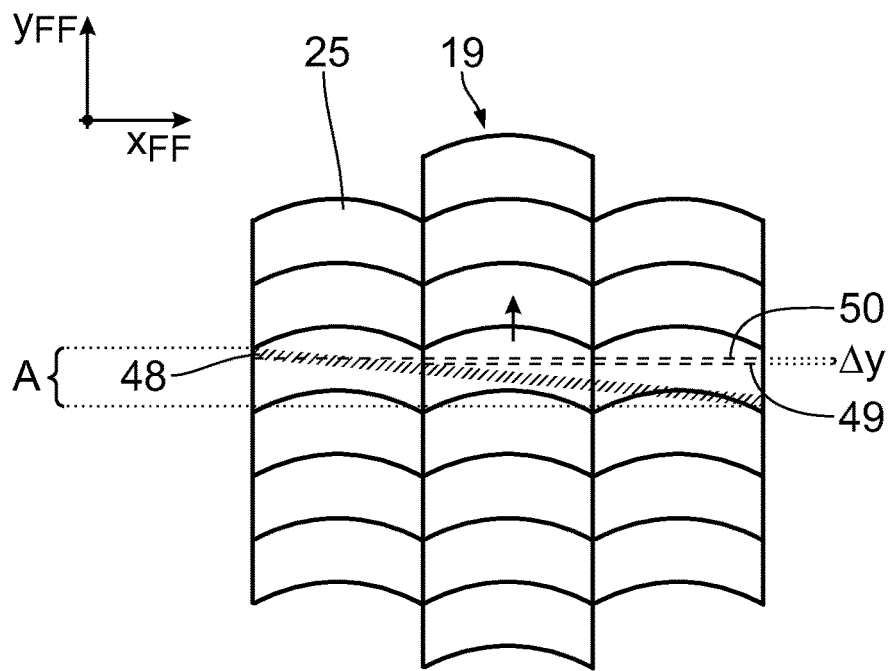
Figure 17:
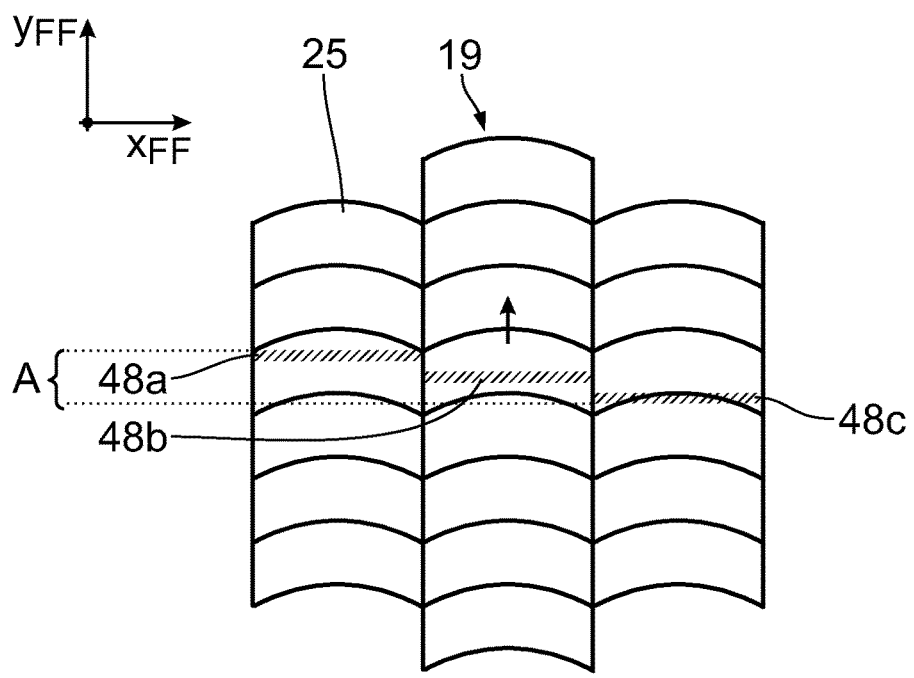
Figure 18:
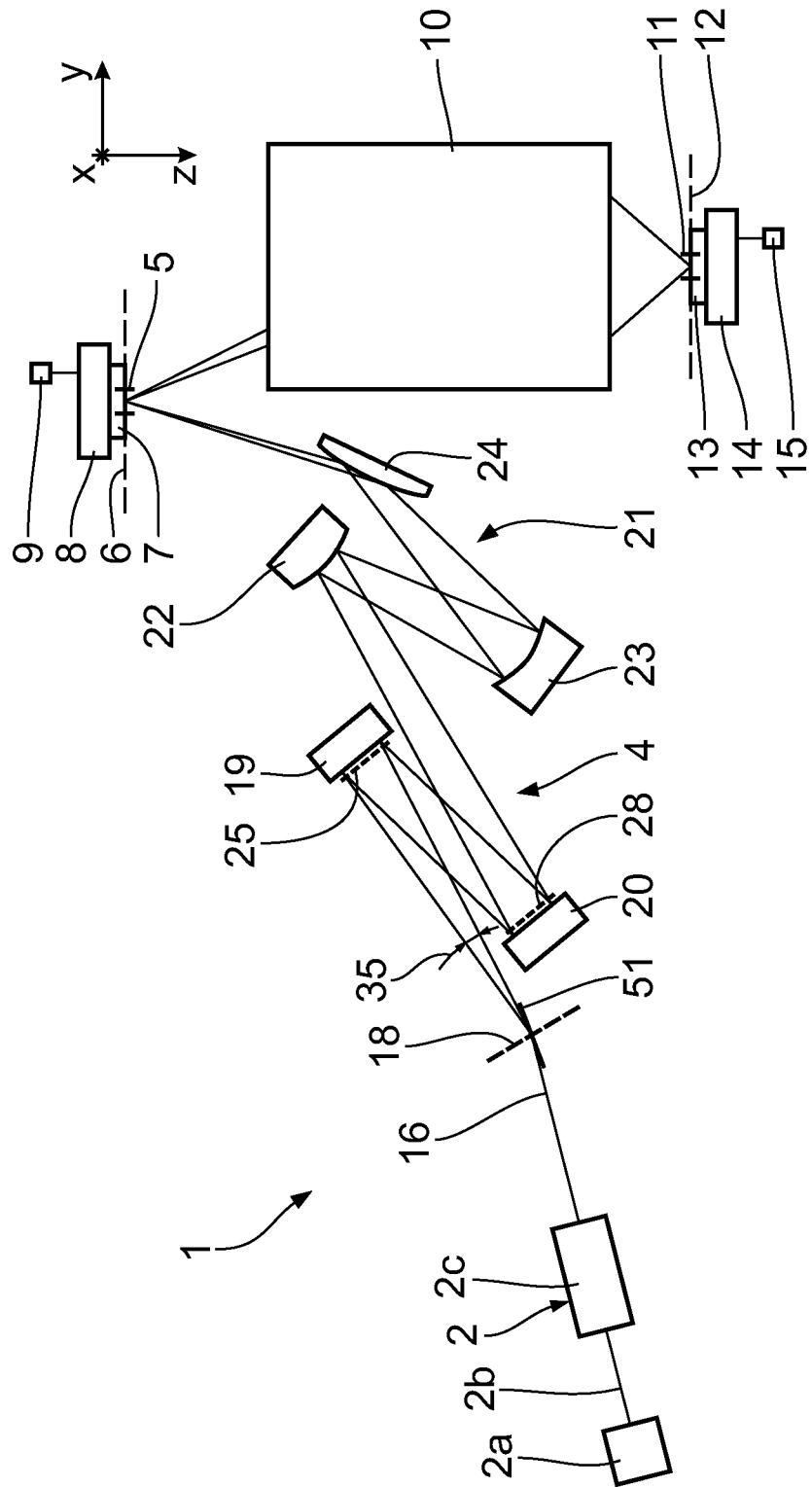
Figure 19:
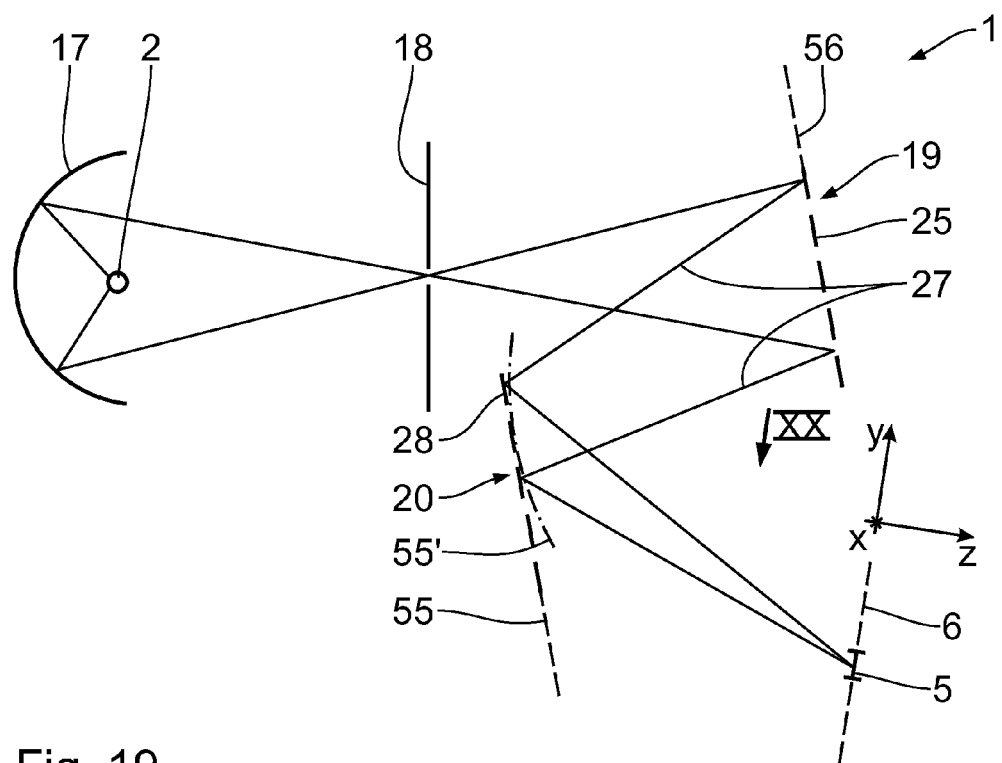
Figure 20:
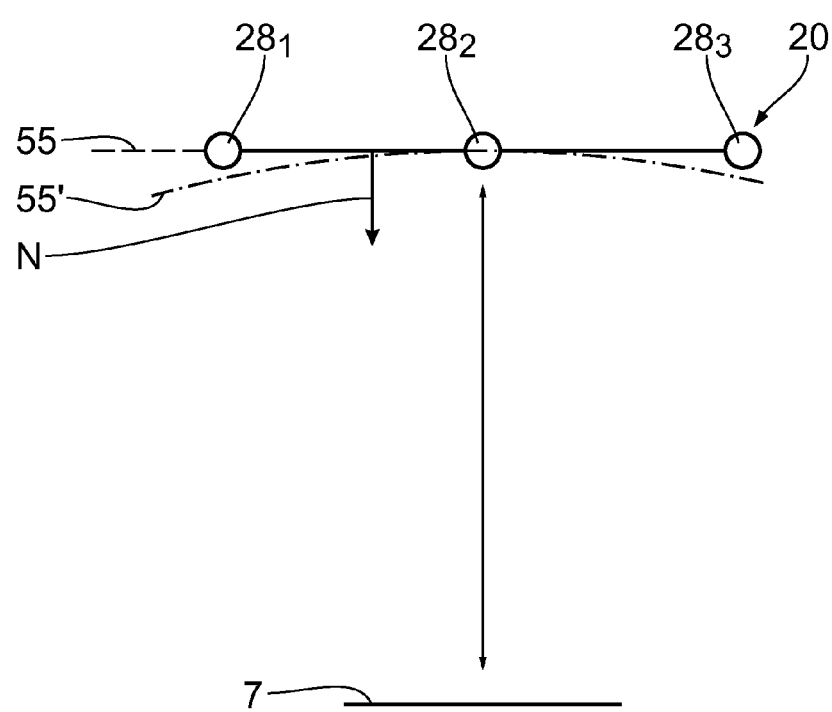
Figure 21:
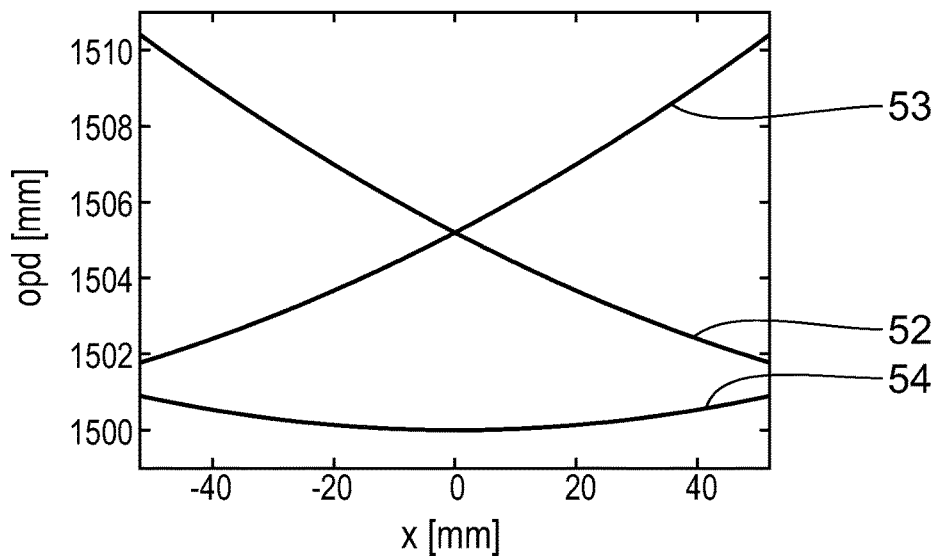
Figure 22:
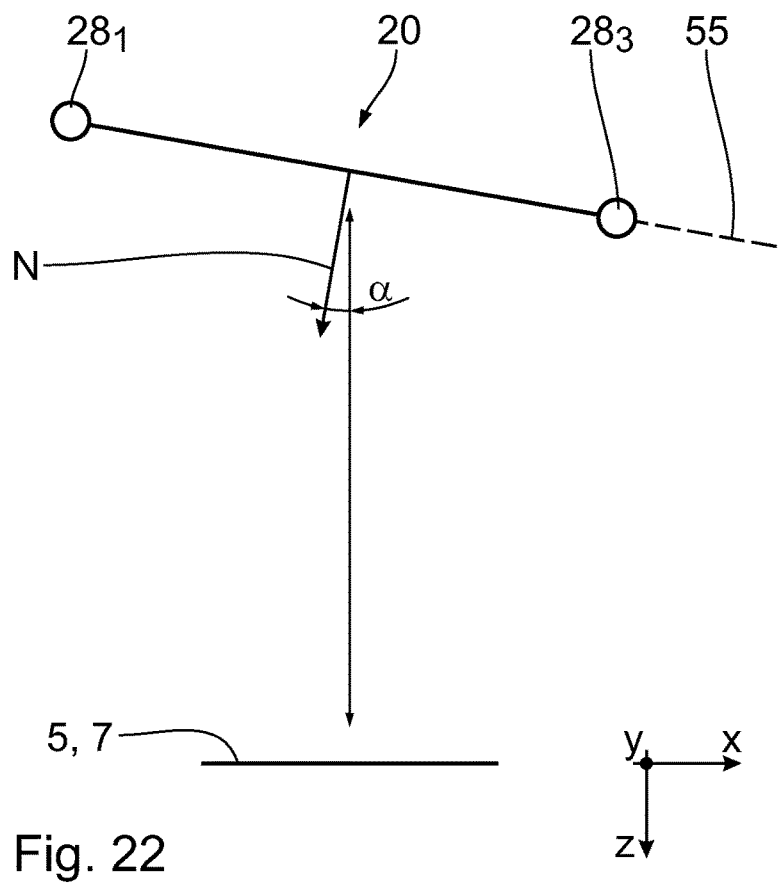
Figure 27:
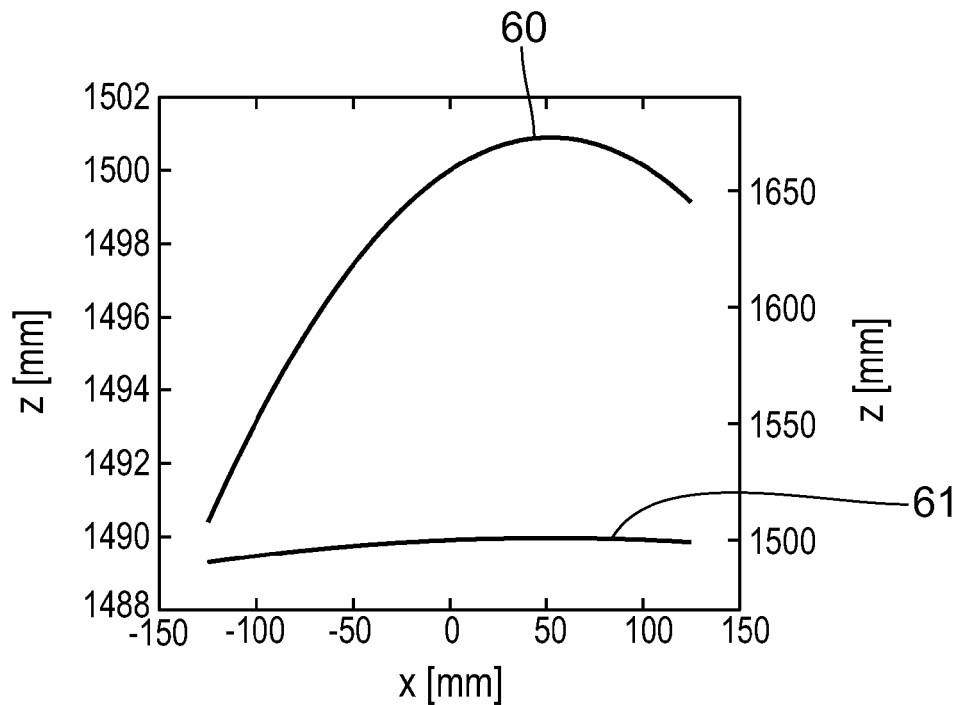
Figure 28:
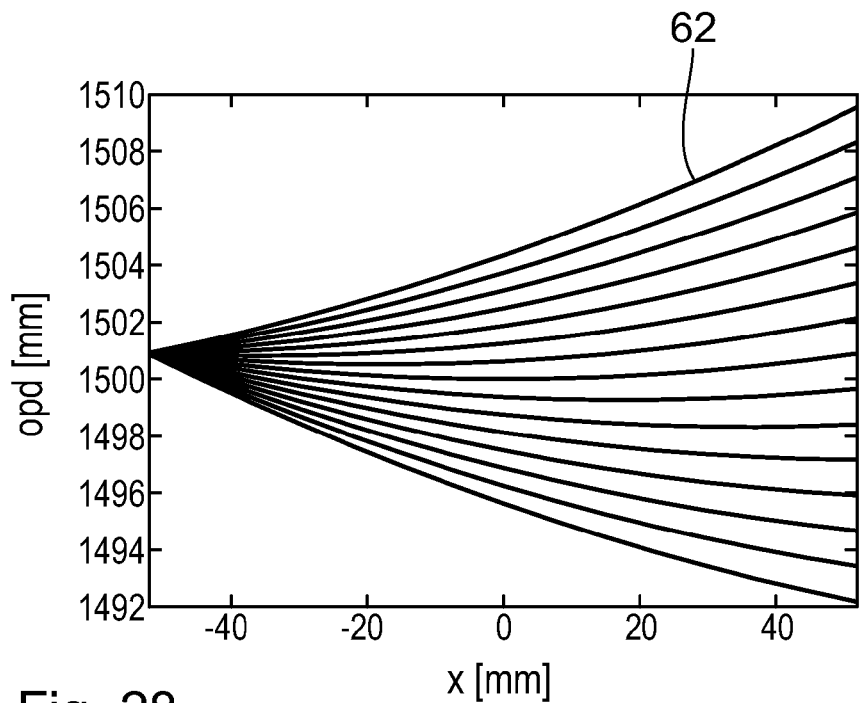
Figure 29:
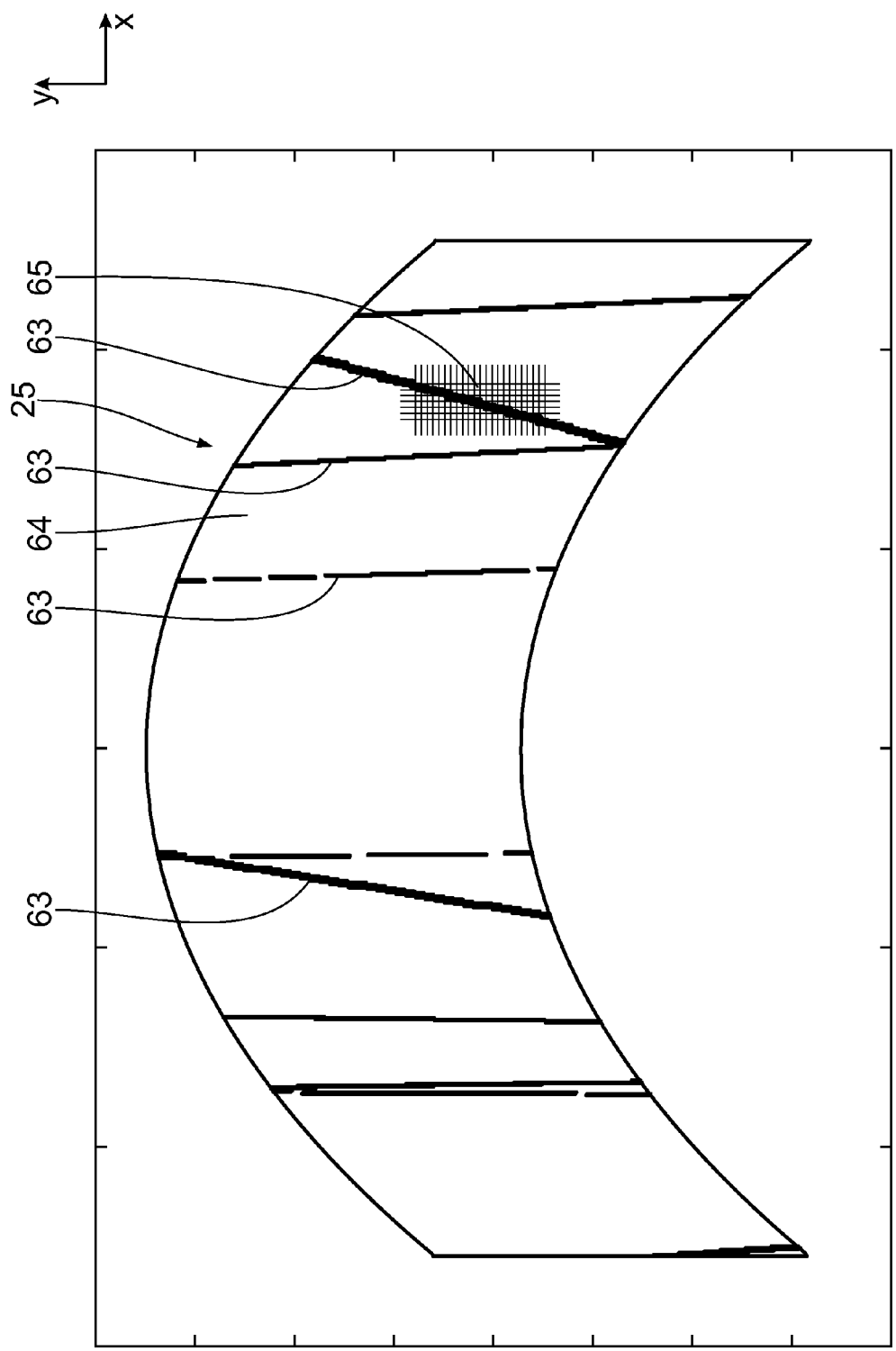
Figure 30:
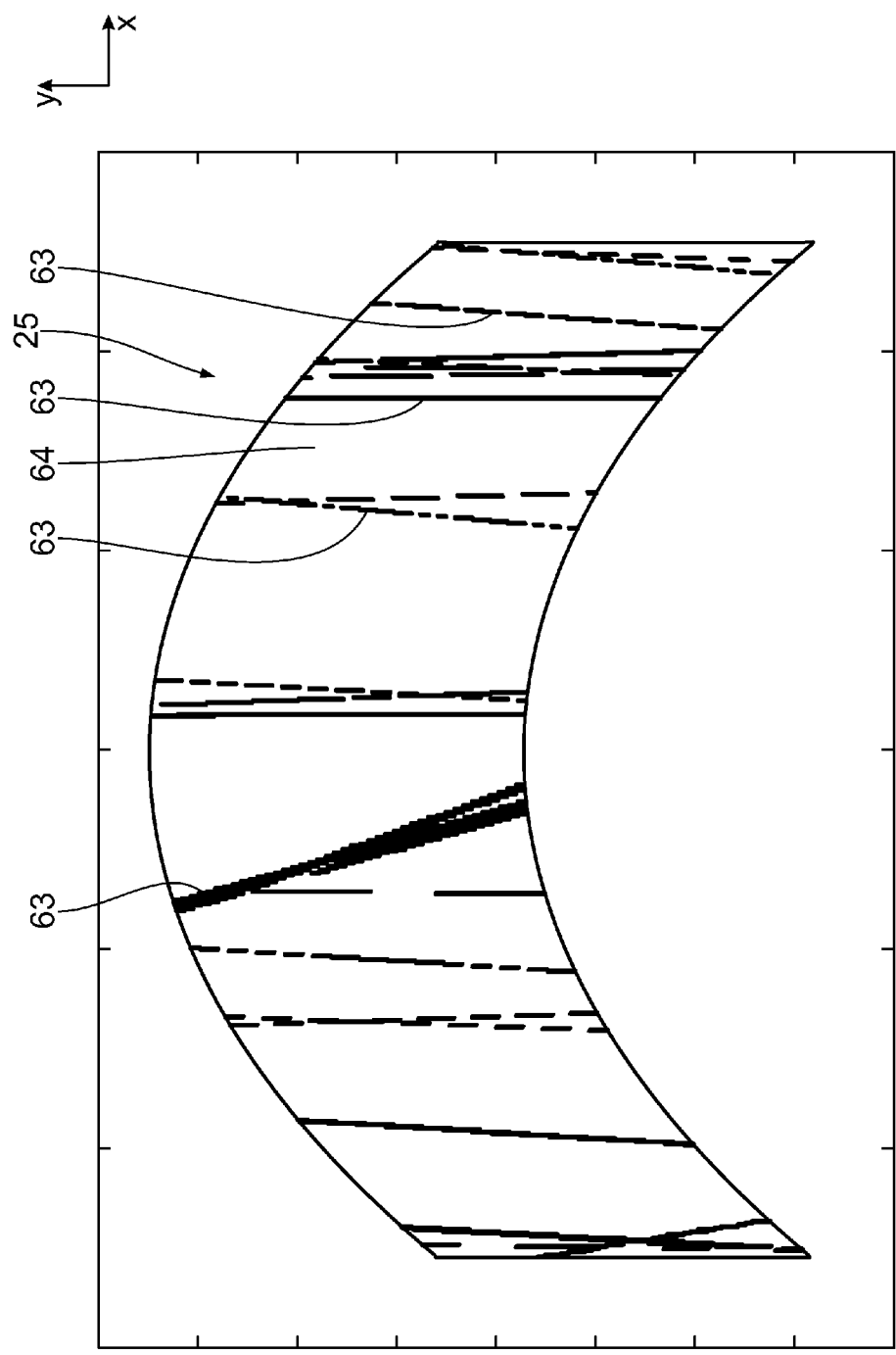
Figure 31:
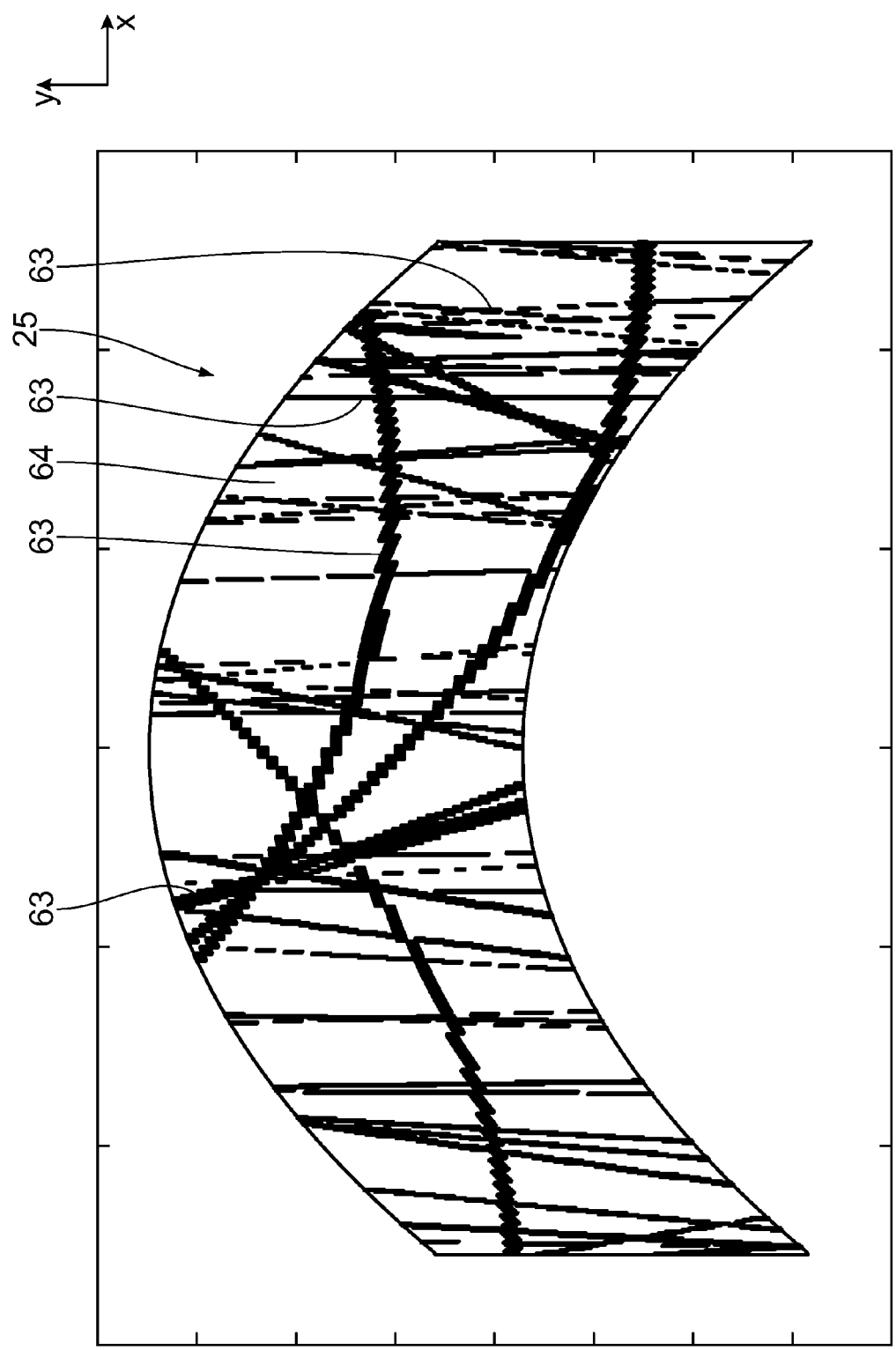
Figure 32:
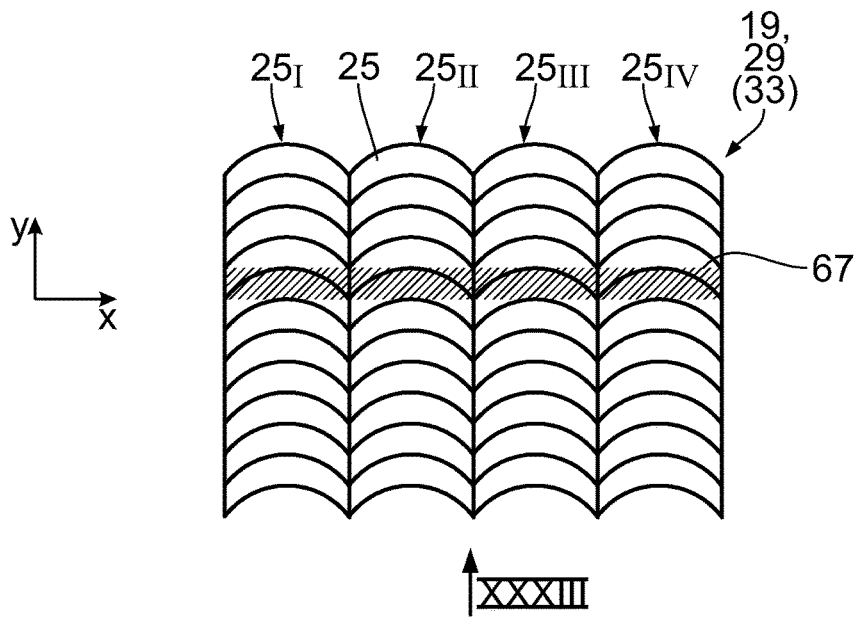
Figure 33:
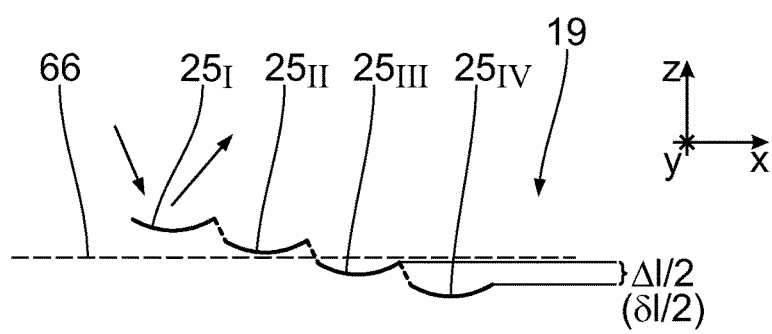
Figure 34:
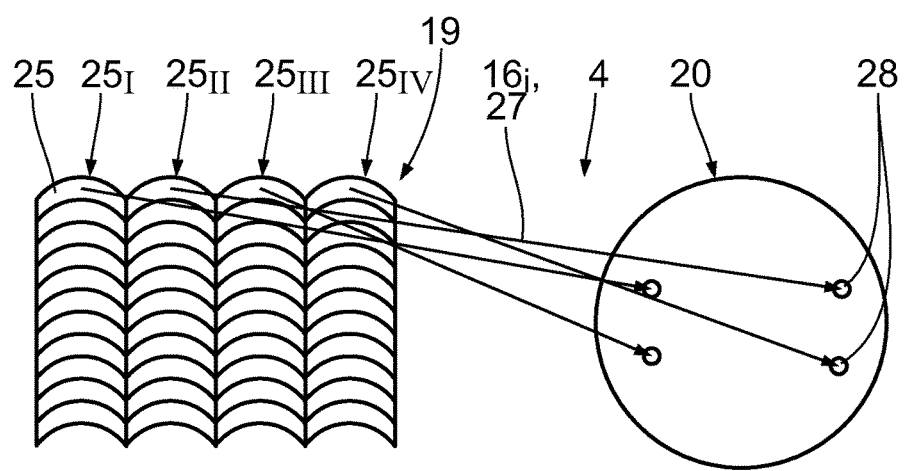

FIG. 13 shows, in an illustration similar to FIG. 12, a plan view of the field facet mirror and of the illumination field according to FIG. 12, wherein an imaging point assignment as in FIG. 12 is specified for exactly one of the field facets and the illumination field and wherein, additionally, respectively one facet region is specified on all other field facets and wherein the mutually superposing images of these facet regions are likewise depicted in the illumination field;

FIGS. 14 and 15 show two examples for sequential scanning of in each case continuous scanning regions on the field facet mirror, wherein the scanning region areas of these scanning regions are slightly smaller in each case than the area of one of the facets;

FIGS. 16 and 17 show variants of scanning region areas over the field facets, which extend over a plurality of field facets;

FIG. 18 shows, schematically and in relation to an illumination optical unit, a further embodiment of a projection exposure apparatus for EUV projection lithography in a meridional section;

FIG. 19 schematically shows the main components of an illumination system of the projection exposure apparatus according to FIG. 18;

FIG. 20 shows, in a schematic plan view approximately corresponding to the viewing direction XX in FIG. 19, three selected pupil facets of the pupil facet mirror of the illumination optical unit and of a reticle of the projection exposure apparatus according to FIGS. 18 and 19 for highlighting optical path length differences of illumination channels within the illumination optical unit;

FIG. 21 shows, in a diagram, a field profile of optical path lengths between the pupil facets according to FIG. 20 over the field coordinate x of the reticle;

FIG. 22 shows, in an illustration similar to FIG. 20, two selected pupil facets and the reticle in one arrangement variant, in which the pupil facet mirror is tilted in such a way that a normal on the main mirror surface of the pupil facet mirror is arranged at a tilt with respect to a plane of incidence of the illumination light partial beams on a main mirror surface of the field facet mirror;

FIGS. 23 to 26 show diagrams, in the style of FIG. 21, in which field profiles of optical path lengths are plotted between various pupil facets and the reticle in the arrangement of the pupil facet mirror in relation to the reticle according to FIG. 22 for various tilt angles of the pupil facet mirror;

FIG. 27 shows, in a diagram, a curvature of a main field surface of the pupil facet mirror, which leads to a parabolic pupil facet mirror-reticle distance function, wherein this distance function is depicted with two different scales;

FIG. 28 shows, in a diagram similar to FIG. 21 and FIGS. 23 to 26, the field profile of optical path lengths between various pupil facets of a pupil facet mirror with a main mirror surface, curved in accordance with FIG. 27, over the reticle;

FIGS. 29 to 31 show different embodiments of a field facet of a field facet mirror which can be used in one of the embodiments of the illumination optical units in a projection exposure apparatus, wherein line-like regions on a reflection surface of the field facet carry an illumination light-blocking coating, wherein FIG. 29 shows a configuration of the blocking coating regions optimized for a "y-dipole" illumination setting, FIG. 30 shows a corresponding configuration optimized for an "x-dipole" illumination setting and FIG. 31 in turn shows a corresponding configuration optimized for a plurality of different illumination settings, in which this field facet can be used for reflecting guidance of the illumination light;

FIG. 32 shows, in an illustration similar to FIGS. 14 to 17, a further example for sequential scanning of a continuous scanning region on a further embodiment of a field facet mirror;

FIG. 33 schematically shows a side view of reflection surfaces of the field facets of the field facet mirror according to FIG. 32, as seen from the viewing direction for XXXII in FIG. 32; and FIG. 34 shows a schematic plan view showing both the field facet mirror according to FIG. 32 and an arrangement region for an associated pupil facet mirror, wherein four illumination channels are highlighted in an exemplary manner.

Figure 1:
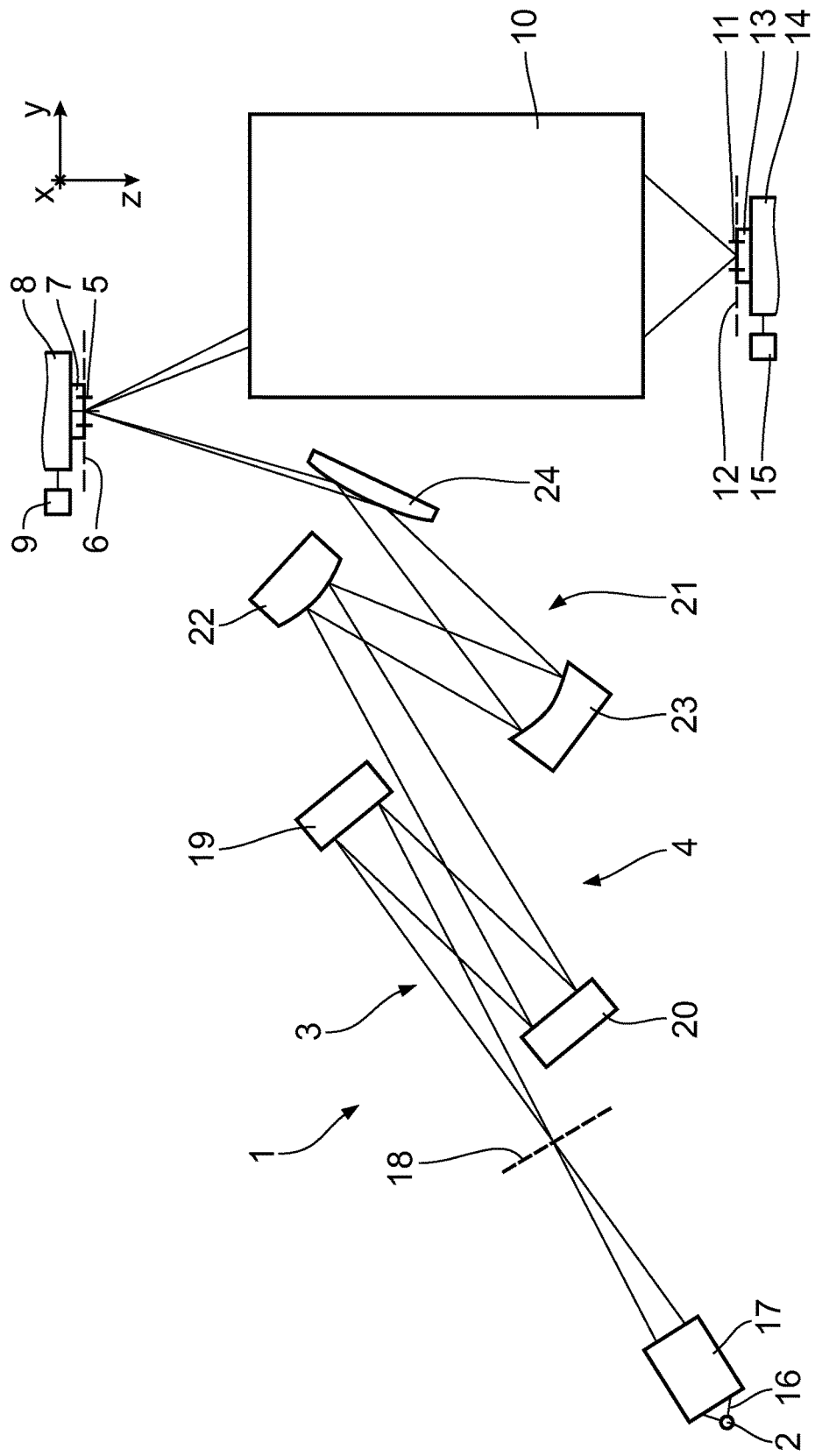

FIG. 1 schematically shows a meridional section of a projection exposure apparatus 1 for microlithography. The projection exposure apparatus 1 has a light or radiation source 2. An illumination system 3 of the projection exposure apparatus 1 comprises an illumination optical unit 4 for exposing an illumination field, coinciding with an object field 5, in an object plane 6. The illumination field may also be larger than the object field 5, in particular transversely to a displacement direction of the object holder 8. The illumination field may also be smaller than the object field 5, in particular along a displacement direction of the object holder 8. Here, an object in the form of a reticle 7 arranged in the object field 5 is exposed, which reticle is held by an object or reticle holder 8. The reticle 7 is also referred to as a lithography mask. The object holder 8 can be displaced along a displacement direction via an object displacement drive 9. A projection optical unit 10 serves for imaging the object field 5 in an image field 11 in an image plane 12. A structure on the reticle 7 is imaged on a light-sensitive layer of a wafer 13 arranged in the region of the image field 11 in the image plane 12. The wafer 13 is held by a wafer holder 14 (likewise not depicted here). The wafer holder 14 can likewise be displaced along the displacement direction, synchronized with the object holder 8, via a wafer displacement drive 15.

The radiation source 2 is an EUV radiation source with emitted used radiation in the range between 5 nm and 30 nm. Here, this can be a radiation source based on a synchrotron or a free electron laser (FEL). A plasma source, for example a GDPP (gas discharge-produced plasma) source or an LPP (laser-produced plasma) source, may also be used as the radiation source 2. A person skilled in the art finds information in respect of such a radiation source in e.g. U.S. Pat. No. 6,859,515 B2. The light source 2 operates in a pulsed fashion, i.e. emits a sequence in time of light or radiation pulses. A temporal distance T between two light pulses adjacent in time is inversely related to the repetition rate of the light source 2, which e.g. lies in the range from 1 to 100 kHz, e.g. at 50 kHz. The duration of a light pulse is much shorter than the distance T between two light pulses adjacent in time, i.e. the pauses during which no EUV radiation is emitted are much longer than the time periods during which EUV radiation is emitted. The coherence time or the coherence duration emerges from the used spectral bandwidth of the EUV radiation and, in turn, is much shorter than the duration of the light pulse. The used spectral bandwidth can, in particular, be smaller than the spectral bandwidth present at the location of the light source 2.

EUV radiation 16, which emanates from the radiation source 2, is focused by a collector 17. A corresponding collector is known from EP 1 225 481 A. After the collector 17, the EUV radiation 16 propagates through an intermediate focus plane 18 before it impinges on a field facet mirror 19. The field facet mirror 19 is a first facet mirror of the illumination optical unit 4. The field facet mirror 19 has a plurality of field facets, which are not depicted in FIG. 1. The field facets in turn can respectively be subdivided into a plurality of individual mirrors, which is likewise not depicted in the drawing. The field facet mirror 19 is arranged in a plane of the illumination optical unit 4 which is optically conjugate to the object plane 6.

In the following text, the EUV radiation 16 is also referred to as illumination light or imaging light.

After the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate to the intermediate focus plane 18 and to a pupil plane of the projection optical unit, or which coincides with this pupil plane. The pupil facet mirror 20 comprises a plurality of pupil facets, which are not depicted in FIG. 1. Field facets 25 of the field facet mirror 19 are imaged into the object field 5 with the aid of the pupil facets of the pupil facet mirror 20 and a subsequent imaging optical assembly in the form of a transmission optical unit 21, comprising mirrors denoted by 22, 23 and 24 in the sequence of the beam path. The last mirror 24 of the transmission optical unit 21 is a grazing incidence mirror. Respectively one illumination channel, which guides a partial beam of the illumination light 16, is predetermined by a first facet, i.e. by one of the field facets of the field facet mirror 19, and an associated second facet, i.e. by one of the pupil facets of the pupil facet mirror 20.

In order to simplify the description of positional relationships, FIG. 1 plots a Cartesian xyz-coordinate system as a global coordinate system for the description of the positional relationships of components of the projection exposure apparatus 1 between the object plane 6 and the image plane 12. The x-axis extends perpendicular to the plane of the drawing and into the latter in FIG. 1. In FIG. 1, the y-axis extends to the right and parallel to the displacement direction of the object holder 8 and of the wafer holder 14. In FIG. 1, the z-axis extends downward, i.e. perpendicular to the object plane 6 and to the image plane 12.

The x-dimension over the object field 5 or the image field 11 is also referred to as field height.

Figure 2:
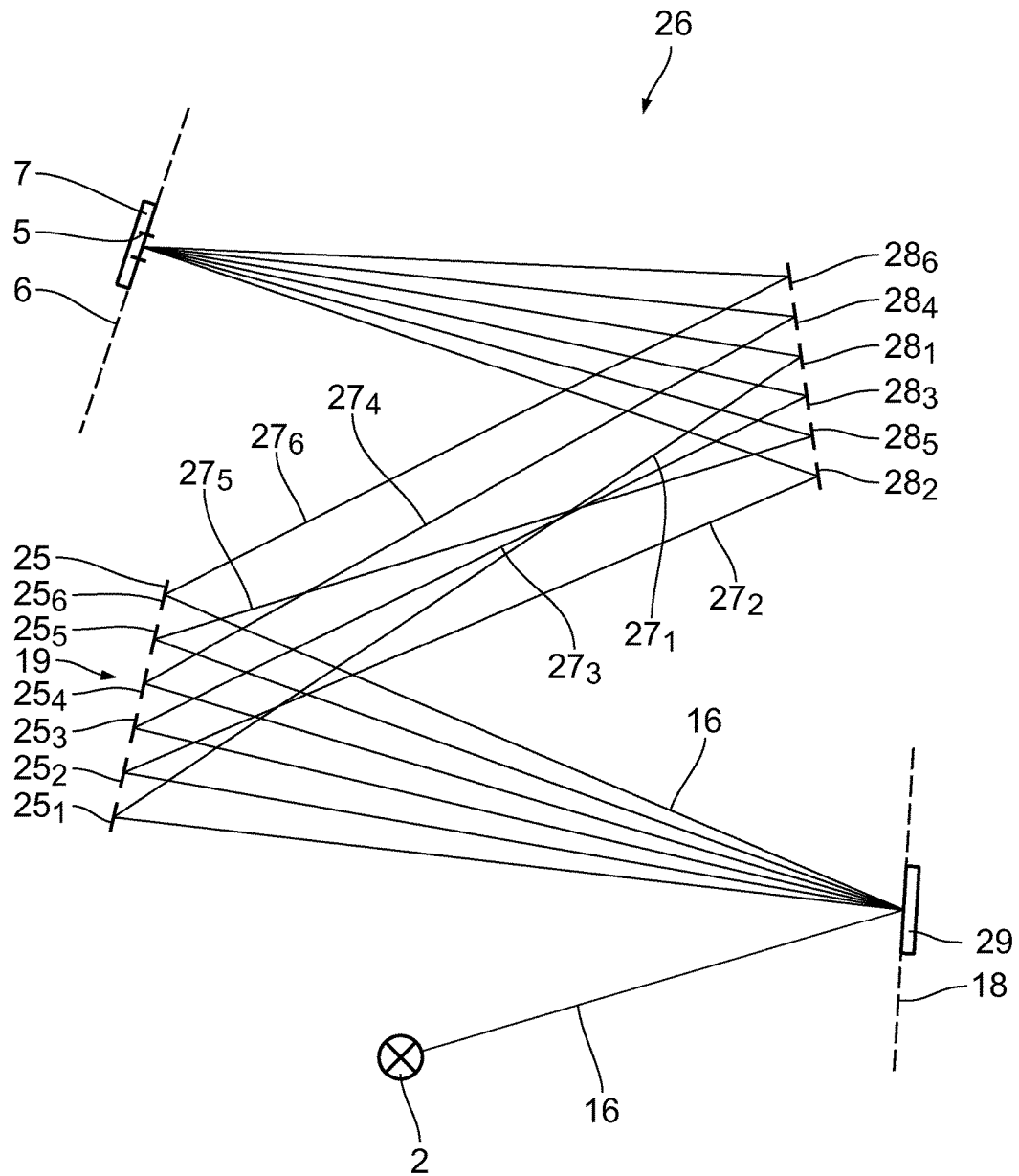

FIG. 2 shows a variant of an illumination optical unit 26, which can be used in the projection exposure apparatus 1 in place of the illumination optical unit 4. Components which correspond to those already explained above with reference to FIG. 1 are denoted by the same reference signs and will not be discussed again in detail. Initially, the description below relates to the guidance of the illumination light 16 without the influence of an optical retardation component, which is yet to be explained in more detail below.

FIG. 2 shows a beam path of six illumination channels $27_1$, $27_2$, $27_3$, $27_4$, $27_5$ and $27_6$, by which the partial beams $16_k$ (k=1, ... 6) of the illumination light 16 are guided. What is depicted is the beam path between the light source 2 and the reticle 7, wherein the beam path is merely indicated schematically between the light source 2 and the intermediate focus plane 18. The optical path between light source 2 and intermediate focus plane 18 is approximately constant for the illumination light 16. The field facet mirror 15 decomposes the illumination light 16 into partial beams, which are guided along the illumination channels $27_1$ to $27_6$. That field facet 25, at which the illumination light partial beam of the illumination channel $27_1$ is reflected, is denoted as field facet $25_1$ below, wherein, for the further illumination channels $27_2$ to $27_6$, corresponding indexing is undertaken for both the field facets 25 and for the pupil facets 28. By way of example, the field facet $25_3$ and the pupil facet $28_3$ belong to the illumination channel $27_3$. The partial beams $16_k$ of the illumination light 16 are indexed accordingly below, and so, for example, the illumination light partial beam $16_3$ belongs to the illumination channel $27_3$.

Depending on the differences in the path lengths of the beam paths, different travel times emerge for the illumination light partial beams $16_k$, which are guided over the illumination channels $27_1$ to $27_6$. Each illumination light partial beam $16_k$ on its own generates illumination of the illumination field 5, which is not regular but contains a quasi-random intensity variation, referred to as speckle. The speckle contrast increases as the number of transverse modes of the light source decreases. If all modes have the same intensity, the relative speckle contrast equals the inverse square root of the mode number. More information on speckles can be found in Joseph W. Goodman, Speckle Phenomena in Optics, Roberts & Company 2010.

If the path length difference between two illumination channels 27 is smaller than the coherence length of the illumination light 16, wherein the coherence length emerges from multiplying the coherence time of the illumination light by the speed of light, the associated illumination light partial beams $16_k$ may interfere with one another. In the best case, the residual contrast of the combined illumination of the illumination field 5 by two or more illumination light partial beams $16_k$ then equals that which would result in the case of illumination by only one partial beam. Particularly in the case of a light source 2 with only a few modes, there may additionally be a systematic interference structure in the illumination on the illumination field 5, which may even lead to a stronger contrast than in the case of a single illumination light partial beam 16. An example of this is formed by the superposition of two partial beams 16 at a small angle, which leads to periodic full modulation.

If the travel time difference between two illumination channels 27 is greater than the coherence length of the illumination light 16, the two independent speckle patterns of the two illumination channels superpose, leading to an improvement in the regularity of the illumination of the illumination field 5. If the travel time difference between two illumination channels 27 is greater than the coherence length of the illumination light 16, the superposition in the illumination field 5 therefore leads to an advantageous behavior, while a travel time difference less than the coherence length leads to no improvement or even to a disadvantageous modification of the regularity.

The differences between the travel times of the illumination light partial beams 16 along the illumination channels $27_1$ to $27_6$ is therefore selected in such a way in the advantageous embodiment depicted in FIG. 2 that the travel time along all pairs of illumination channels $27_k$, $27_l$ differs in each case by more than the coherence time of the illumination light. What this implies is that the minimum travel time difference between the illumination channel 27 with the shortest path length and the illumination channel with the longest path length, measured between a light source 2 for the illumination light 16 and the illumination field 5, at least equals the product of the illumination channel number and the coherence time of the illumination light. Since the travel time differences along the illumination channels $27_1$ to $27_6$ depend on the location of incidence in the illumination field 5 and the aforementioned condition must hold for each location of incidence, the travel time difference between the illumination channel with the shortest path length and the illumination channel with the longest path length may be substantially greater than the product of the illumination channel number and the coherence time of the illumination light 16 for at least some field locations, in particular also for almost all field locations.

Figure 3:
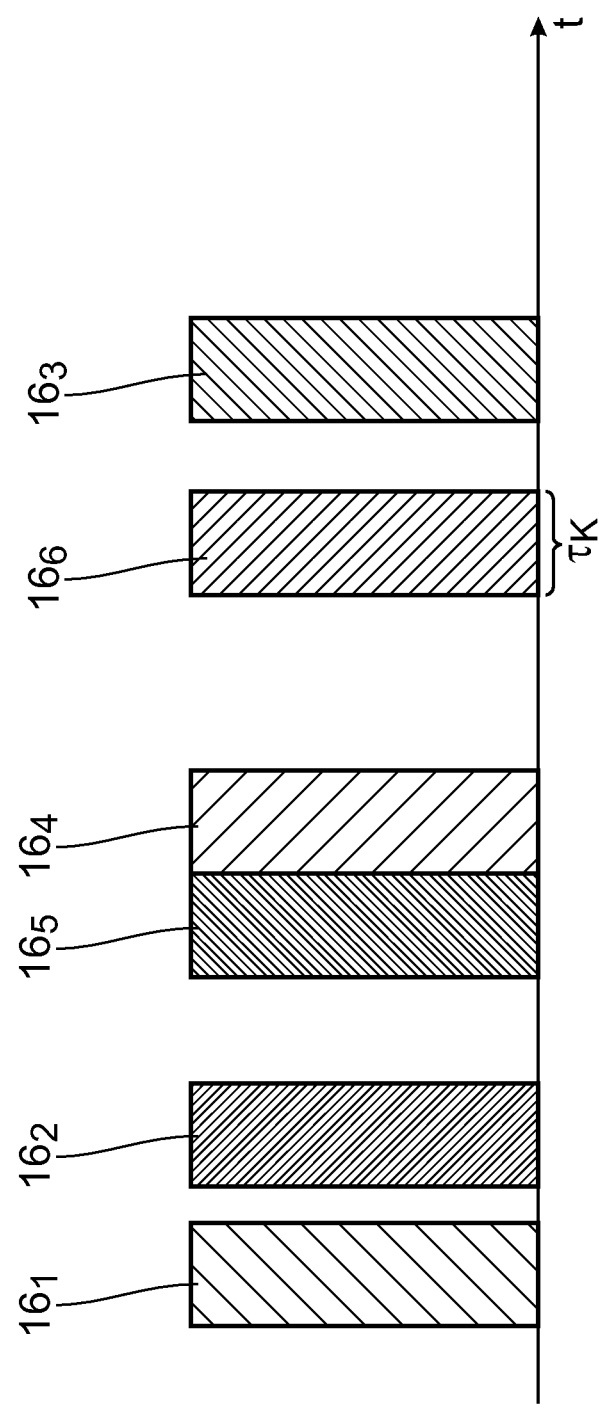
FIG. 3 shows a sequence in time of times of impingement of illumination light partial beams on the lithography mask.

FIG. 3 clarifies the effect of this configuration of the illumination optical unit 4 or of the illumination optical unit 26. Times of incidence on the reticle 7 of illumination light components $16_1$ to $16_6$, which were guided along the illumination channels $27_1$ to $27_6$ and which simultaneously left the light source 2, are depicted along the time axis t. Therefore, absolute time specifications on the depicted time axis t have no meaning; only time differences are of relevance. The width of the plotted bar represents the coherence time or coherence duration $\tau_{k_K}$ of the illumination light 16. Overall pulse durations of the illumination channel partial light pulses $16_k$ can be significantly longer than the bars plotted in FIG. 3. These overall pulse durations of the illumination channel partial light pulses $16_k$ play no role for the following consideration of interference.

The illumination optical units 4 and 26 are configured in such a way that the coherence duration bars of the partial light pulses $16_k$ do not overlap.

Therefore, the regularity of the illumination of an illumination field is optimized by such an embodiment of the illumination optical unit since each used illumination channel $27_k$ leads to an improvement in the regularity.

The configuration of the illumination optical unit in accordance with the described exemplary embodiments can ensure that a travel time difference greater than the coherence length is obtained for all pairs of illumination channels $27_k$, $27_l$. This results in a corresponding improvement in the regularity of the field illumination. These advantages of the described embodiments become important, particularly in the case of illumination light sources comprising less than 10 transverse modes and having a correspondingly large transverse coherence length. The transverse coherence length must be distinguished from the coherence length emerging by multiplying the coherence time of the illumination light 16 by the speed of light. Furthermore, the advantages of the described embodiments are particularly important in the case of broadband light sources. Finally, the advantages of the described embodiments become important in illumination optical units comprising less than several hundred illumination channels, in particular less than one hundred illumination channels.

What can be avoided by the described embodiments is a too short travel time difference between an illumination channel with a shortest travel time or path length within the illumination optical unit and an illumination channel with a longest path length within the illumination optical unit such that, in particular, disturbing speckle generation could not be precluded in that case. Such a too short travel time difference between the illumination channel with the shortest path length and the illumination channel with the longest path length, which is avoided by the described embodiments, emerges as product of a number of the illumination channels and the coherence length.

FIG. 2 shows the configuration of the illumination optical unit 26 using an optical retardation component 29. The optical retardation component 29 splits the incident illumination light 16 into a plurality of parts with different retardation, which are spatially superposed in the object field 5. The travel time differences between the travel times of the illumination light partial beams along the illumination channels $27_1$ to $27_6$ are composed in this case from the travel time differences emerging from the different beam paths of the illumination channels $27_1$ to $27_6$ and the additional retardation travel time differences which the illumination light partial beams experience due to the effect of an optical retardation component 29. The illumination light partial beam $16_k$ along the illumination channel $27_k$ therefore consists of a plurality of components $16_k^l$, which each have their own travel time, wherein the index k denotes the illumination channel and the index l denotes the retardation by the optical retardation component 29.

In the embodiment according to FIG. 2, the optical retardation component 29 is embodied as a reflecting stepped mirror, which is arranged in the intermediate focus plane 18, i.e. at the location of an intermediate focus between the light source 2 and the field facet mirror 19. In the illumination optical unit 26 according to FIG. 2, this intermediate focus is generated by a collector, not depicted in FIG. 2, in the beam path of the illumination light 16 after the light source 2.

Figure 4:
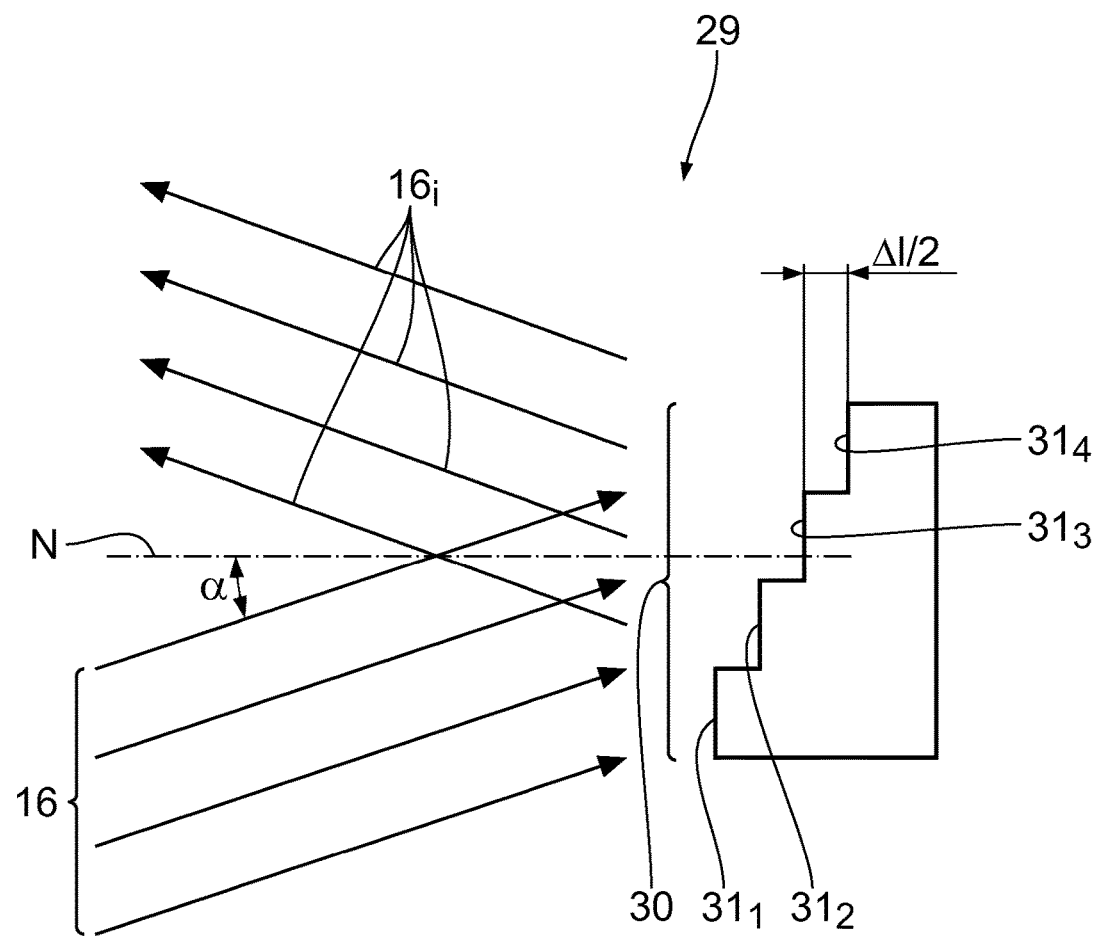
FIG. 4 shows a section through an optical retardation component, which is used in an illumination optical unit of the projection exposure apparatus according to FIG. 2.

FIG. 4 shows the optical retardation component 29 in more detail. A reflection surface 30 of the optical retardation component 29 comprises a total of four mirror steps $31_1$, $31_2$, $31_3$ and $31_4$ in the embodiment according to FIG. 4. Neighboring mirror steps 31 are at a distance of $\Delta l/2$ from one another along a normal N on the reflection surface 30. Since an angle of incidence α of the illumination light 16 on the optical retardation component 29 is small, a retardation travel time difference which corresponds to an optical path length of $\Delta l$ applies to a good approximation between the components of the illumination light 16 which are reflected at adjacent mirror steps $31_1$, $31_2$, $31_3$ and $31_4$. The combination of the possible radiation paths over the four mirror steps $31_1$, $31_2$, $31_3$ and $31_4$ with the six illumination channels $27_1$, $27_2$, $27_3$, $27_4$, $27_5$ and $27_6$ results in twenty-four illumination light partial beams $16_1^1$ to $16_6^4$. Here, the indexing $16_k^l$ is as already explained above in conjunction with FIG. 2. $\Delta l'$ is the time analog to the path length difference $\Delta l$, i.e. the travel time difference.

Figure 5:
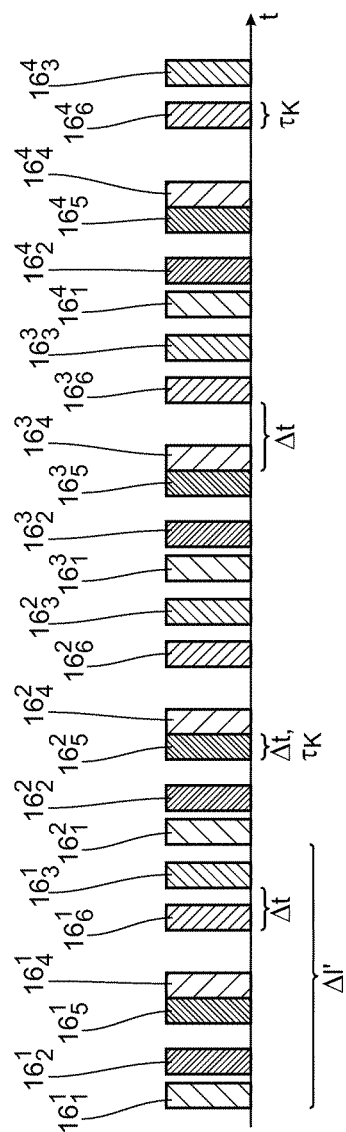
FIG. 5 shows a sequence in time of times of impingement of illumination light partial beams on the lithography mask when using the optical retardation component according to FIG. 4.

In an illustration analogous to FIG. 3, FIG. 5 clarifies the effect of the optical retardation component 29. Times of incidence of illumination light components $16_k^l$ on the reticle 7, which have respectively left the radiation source at a given time, are plotted along a time axis t. As a result of the combined effect of, firstly, the different paths of the illumination channels 27 and, secondly, the additional retardation travel time difference due to the retardation component 29, an overall travel time difference emerges for the depicted six illumination channel partial light pulses $16_1$ to $16_6$ which leads to the time interval, Δt, between the times of incidence of two illumination channel partial light pulses $16_k^l$ incident adjacent in time on the reticle 7, which is always greater than a coherence duration of the illumination light 16 from the light source 2. The times of incidence correspond to the left-hand edges of the bars depicted in FIG. 5, while the widths of the bars, analogously to FIG. 3, equal the coherence duration of the illumination light 16. Thus, $\Delta t > \tau_K$ applies, where $\tau_K$ is the coherence duration of the light source 2. In the case of a free electron laser (FEL) as a light source 2 with a corresponding spectral bandwidth, a coherence length, which corresponds to the coherence duration $\tau_K$, is e.g. 1.35 μm. This applies to a central wavelength of 13.5 nm and a bandwidth $\lambda/\Delta\lambda$ of 100.

Thus, a comparatively large retardation is impressed by the optical retardation component 29. The retardation by the optical retardation component 29 is of the order of magnitude of a retardation step between two adjacent mirror steps $31_1$ to $31_4$. This step dimension is at least $\Delta l/2$ in the case of the optical retardation component, where $\Delta l > \tau_K$ applies. Here $\Delta l$ is the maximum path length difference between the illumination channel 27 with the shortest path length and the illumination channel with the longest path length. $\tau_{K'}$ is the path length analog to the coherence duration $\tau_K$.

In the case of the illumination according to FIG. 5, assuming an extreme time resolution and an extremely short light pulse from the light source 2, the reticle "sees" illumination components 16 from the directions of the illumination light channels $27_1$, $27_2$, $27_5$, $27_4$, $27_6$ and $27_3$ in quick succession. This light showering from different directions repeats a number of times in quick succession, to be precise once per used step of the optical retardation component 29.

Figure 6:
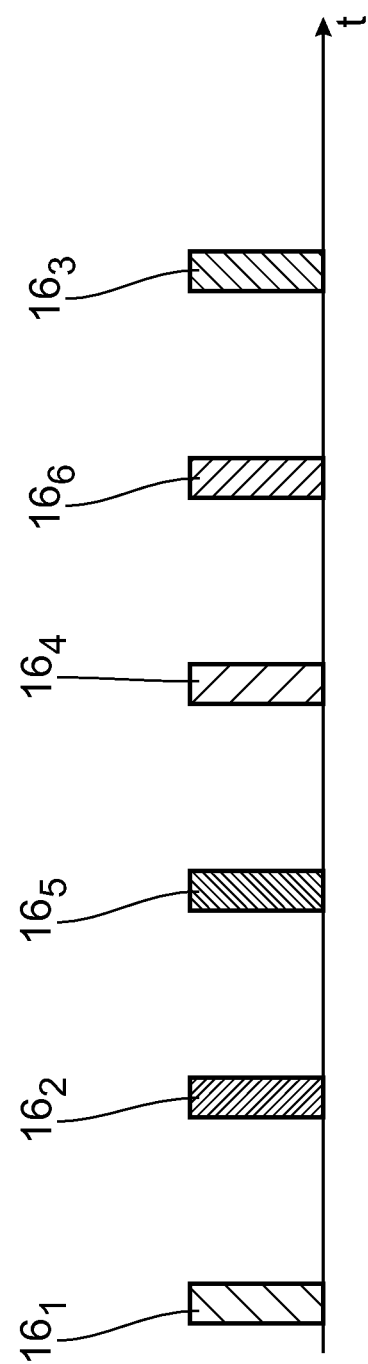
FIG. 6 shows, in an illustration similar to FIG. 3, a sequence in time of times of impingement of illumination light partial beams on the lithography mask.

Analogously to FIG. 3, FIG. 6 shows, along a time axis t, times of incidence of illumination light components $16_1$ to $16_6$, which were guided along the illumination channels $27_1$ to $27_6$ and left the light source 2 at a given time, on the reticle 7. The main difference between FIG. 3 and FIG. 6 is that FIG. 6 is based on an illumination optical unit 4 or 26, in which the path length differences between the illumination light channels $27_1$ to $27_6$ are greater than in the embodiment according to FIG. 3.

Figure 7:
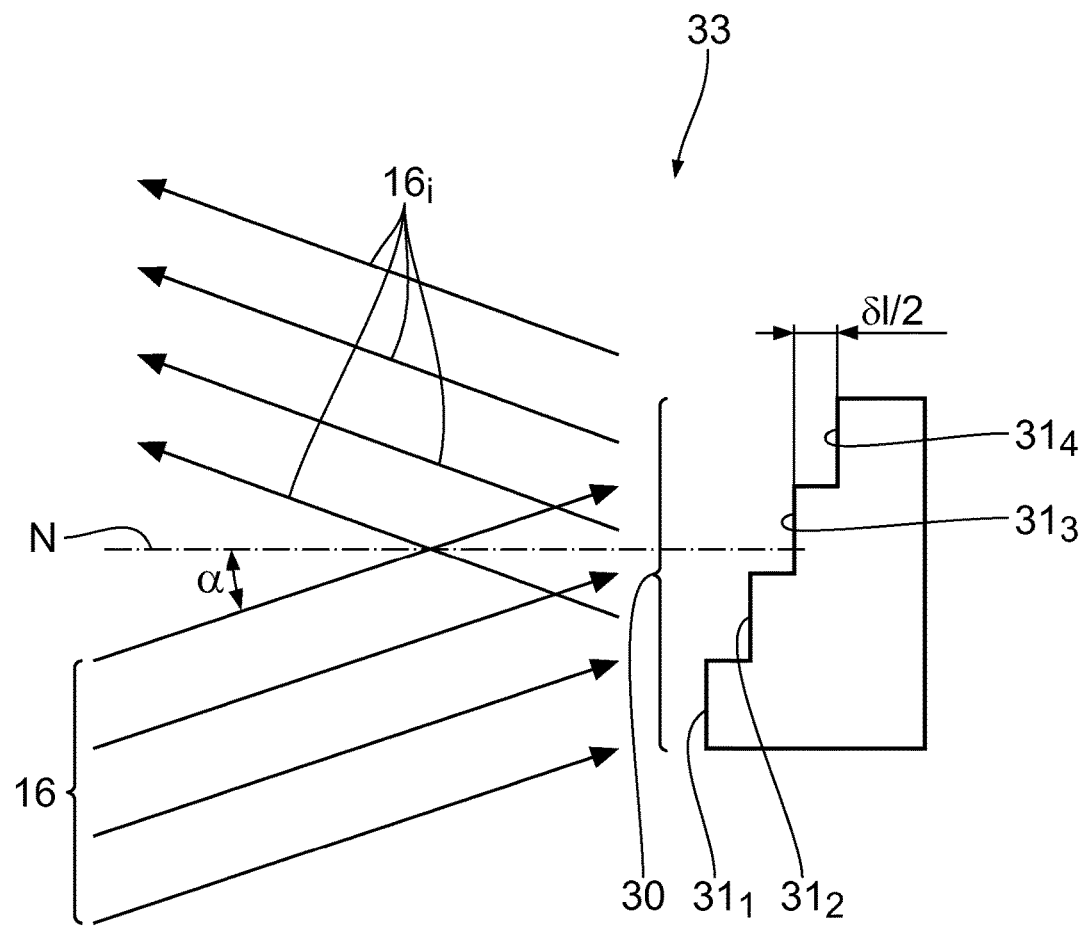
FIG. 7 shows, in an illustration similar to FIG. 4, a further embodiment of an optical retardation component.

FIG. 7 shows a further embodiment of an optical retardation component 33. It is described below where it differs from the optical retardation component 29. A main difference from the optical retardation component 29 lies in the order of magnitude of a retardation step between two adjacent mirror steps $31_1$ to $31_4$. In the optical retardation component 33, this step dimension is $\delta l/2$, where $\tau_{e'} < \delta l < \Delta L/M$ applies. Here, $\Delta L$ is the minimum path length difference along two illumination light channels $27_1$ to $27_6$ and M is the number of steps in the retardation component 33.

Thus, a comparatively small retardation is impressed by the optical retardation component 33, and so all components $16_i^l$ of the illumination light 16, which left the radiation source 2 at a given time and ran over different steps of the retardation component 33 via a specific illumination light channel $27_i$, reached the reticle 7 before components $16_j^l$ of the illumination light 16, which passed over a different illumination channel $27_j$, reach the reticle 7. This is depicted in FIG. 8 in a representation analogous to FIG. 5.

Figure 8:
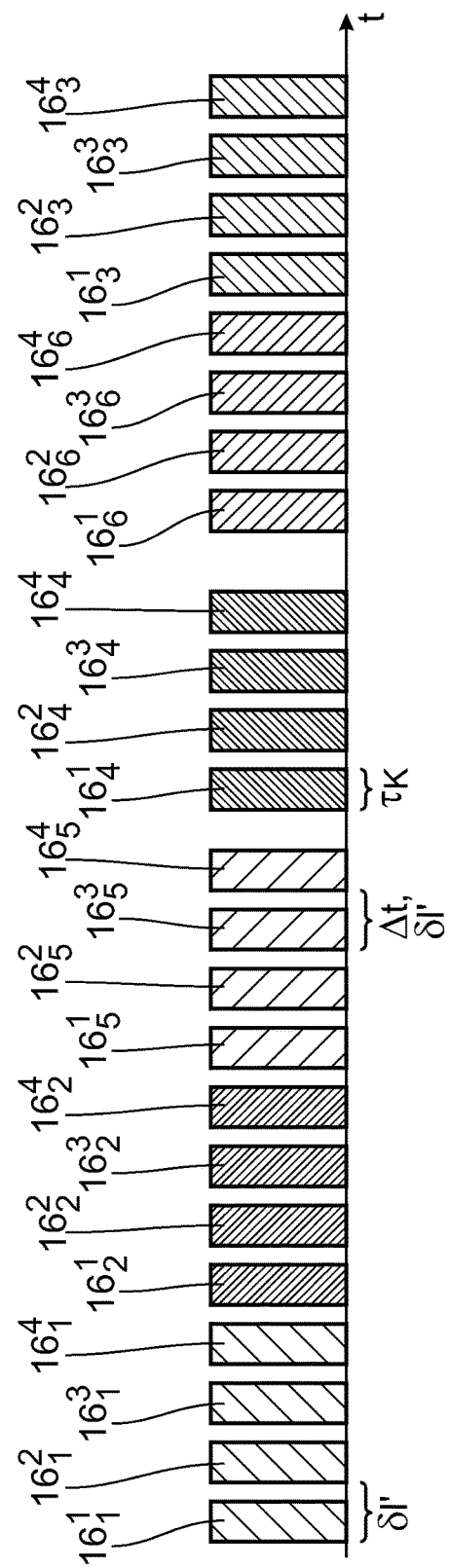
FIG. 8 shows a sequence in time of times of impingement of illumination light partial beams on the lithography mask when using the optical retardation component according to FIG. 7.

In the sequence of incidence in time according to FIG. 8, assuming an extreme time resolution and an extremely short light pulse from the light source 2, the reticle 7 initially "sees" a sequence of components, corresponding to one another in time, of the illumination channel partial light pulses from a first illumination direction, then a sequence of components, corresponding to one another in time, of the illumination channel partial light pulses from a second illumination direction, and so on.

A minimum time interval Δt between the times of incidence of the components, corresponding to one another in time, of the illumination channel partial light pulses $16_k^l$ on the reticle 7 is also greater than the coherence duration $\tau_K$ of the light source 2 in this case. $\delta l'$ is the time analog to the path length difference $\delta l$, i.e. the travel time difference. Here, $\delta l' = \Delta t$ applies.

The optical retardation component 33 can be arranged at the location of the pupil facets of the pupil facet mirror 22. This avoids an additional reflection and the light loss connected therewith. As a result of the small step height, an easier integration into other optical components such as e.g. a facet mirror is possible than is the case where there are larger step heights.

The optical retardation component 29 can be arranged at the location of an intermediate focus. Large step heights are slightly more complicated to produce, and only a single such element is required in the case of placement at the location of an intermediate focus.

In the case of the projection exposure with the aid of the projection exposure apparatus 1, at least part of the reticle 7 in the object field 5 is imaged on a region of the light-sensitive layer on the wafer 13 in the image field 11 for the lithographic production of a microstructured or nanostructured component, in particular a semiconductor component, for example a microchip. Here, the reticle 7 and the wafer 13 are displaced synchronized in time and continuously in the y-direction during the scanning operation.

In the following text, a further embodiment of a microlithographic projection exposure apparatus will be explained. Components and functions which were already explained above are denoted by the same reference signs and are only explained below where this is necessary for the understanding of deviating components or functions.

Figure 9:
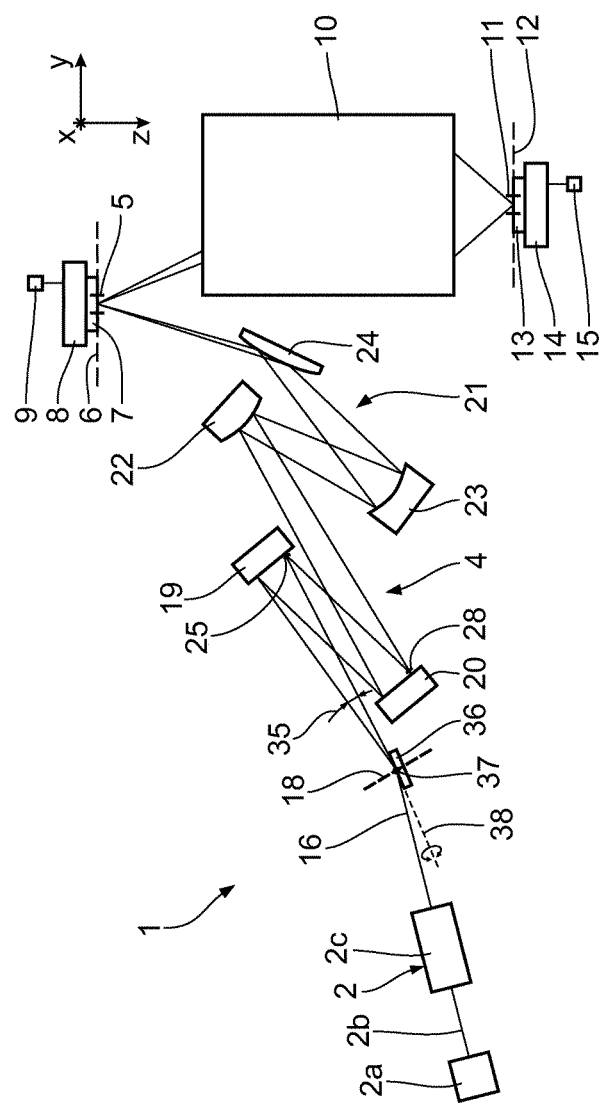
FIG. 9 shows, schematically and in relation to an illumination optical unit, a further embodiment of a projection exposure apparatus for EUV projection lithography in a meridional section.

The microlithographic projection exposure apparatus 1 according to FIG. 9 serves for producing a microstructured or nanostructured electronic semiconductor component. The light or radiation source 2 emits EUV radiation in the wavelength range of, e.g., between 5 nm and 30 nm. In the embodiment according to FIG. 9, the light source 2 is embodied as a free electron laser (FEL). Here, this is a synchrotron radiation source which generates coherent radiation with very high brilliance. Prior publications, in which such FELs are described, are specified in WO 2009/121 438 A1. A light source 2, which can be used, for example, in the embodiment according to FIG. 9, is described in Uwe Schindler "Ein supraleitender Undulator mit elektrisch umschaltbarer Helizität" ["A Superconducting Undulator having Electrically Switchable Helicity"], Research Center Karlsruhe in the Helmholtz Association, Scientific Reports, FZKA 6997, August 2004, and in DE 103 58 225 B3.

The EUV light source 2 has an electron beam supply device 2a for generating an electron beam 2b and an EUV generation device 2c. The latter is supplied with the electron beam 2b via the electron beam supply device 2a. The EUV generation device 2c is embodied as an undulator.

The light source 2 has a mean power of 2.5 kW. The pulse frequency of the light source 2 is 30 MHz. Each individual radiation pulse then carries an energy of 83 µJ. In the case of a radiation pulse length of 100 fs, this corresponds to a radiation pulse power of 833 MW.

A used radiation beam, which is also referred to as an output beam, is used as illuminating or imaging light 16 for the purposes of illuminating and imaging within the projection exposure apparatus 1. The used radiation beam 16 is illuminated with the aid of a scanning device 36, yet to be described below, within an aperture angle 35 which is matched to the illumination optical unit 4 of the projection exposure apparatus 1. Emanating from the light source 2, the used radiation beam 16 has a divergence which is less than 5 mrad. The scanning device 36 is arranged in the intermediate focus plane 18 of the illumination optical unit 4. After the scanning device 36, the used radiation beam 16 is initially incident on the field facet mirror 19. Details in respect of the scanning device 36 are yet to be explained in more detail below on the basis of FIGS. 10 and 11.

In particular, the used radiation beam 16 has a divergence which is less than 2 mrad and preferably less than 1 mrad. The spot size of the used radiation beam on the field facet mirror 19 is approximately 4 mm.

Figure 10:
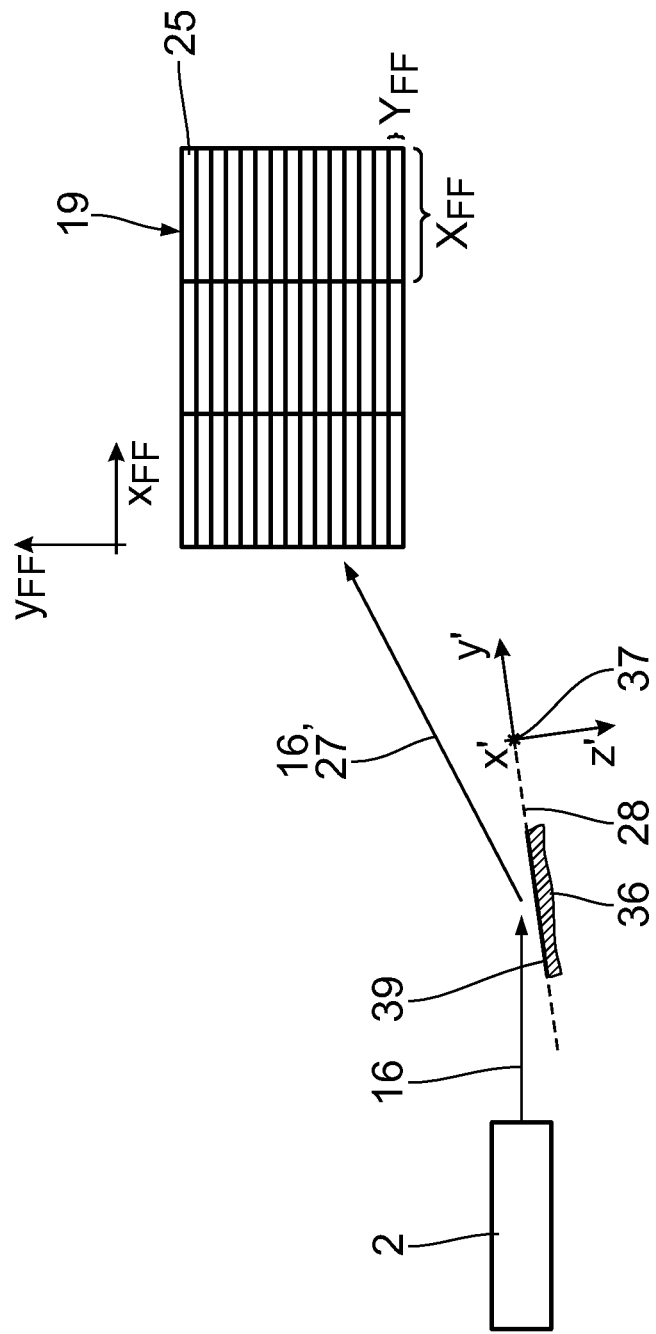
FIG. 10 shows, schematically and in relation to a field facet mirror, some components of an illumination system of the projection exposure apparatus according to FIG. 9 in a plan view, comprising a scanning device for deflecting an EUV output beam of an EUV light source.

In an exemplary manner, FIG. 10 shows a facet arrangement, a field facet array, of field facets 25 of the field facet mirror 19. The field facet mirror 19 represents a facet mirror of an illumination system of the projection exposure apparatus 1. Only some of the actually present field facets 25 are depicted in an exemplary manner in three columns and 15 rows. The field facet array of the field facet mirror 19 has a total of 6 columns and 75 rows. The field facets 25 have a rectangular shape. Other shapes of the field facets 25 are also possible, for example an arcuate shape, as is depicted below in conjunction with FIGS. 12 to 17, or a ring-shaped or partial ring-shaped geometry. Overall, the field facet mirror 19 therefore has 450 field facets 25 in one possible variant. Each field facet 25 has an extent of 50 mm in the horizontal direction in FIG. 10 and of 4 mm in the vertical direction in FIG. 10. Accordingly, the overall field facet array has an extent of 300 mm×300 mm. The field facets 25 are not depicted true to scale in FIG. 10.

After reflection on the field facet mirror 19, the used radiation beam 16, which is split into the pencil of rays or the illumination light partial beam assigned to the individual field facets 25, is incident on the pupil facet mirror 20. Pupil facets 28 of the pupil facet mirror 20, of which FIG. 9 merely depicts one pupil facet 28, are round. Each pencil of rays of the used radiation beam 16 reflected from one of the field facets 25 is assigned to one of these pupil facets 28, and so respectively one impinged facet pair with one of the field facets 25 and one of the pupil facets 28 predetermines an illumination channel or beam guidance channel 27 for the associated pencil of rays of the used radiation beam 16. The channel-by-channel assignment of the pupil facets 28 to the field facets 25 is brought about dependent on a desired illumination by the projection exposure apparatus 1. The output beam 16 is therefore guided along the illumination channel, in sequence over pairs of respectively one of the field facets 25 and respectively one of the pupil facets 28, for predetermining individual illumination angles. It is also possible to simultaneously illuminate a plurality of the field facets 25 and hence a plurality of illumination channels 27. At any given time, the illumination light 16 can be guided over exactly one pair, or else over a plurality of, but generally few, pairs, made of respectively one field facet 25 and respectively one pupil facet 28. The field facets 25 are in each case tilted individually for actuating respectively predetermined pupil facets 28.

The field facets 25 are imaged into the illumination or object field 5 in the reticle or object plane 6 of the projection optical unit 10 of the projection exposure apparatus 1 by the pupil facet mirror 20 and the subsequent transmission optical unit 21 consisting of the three EUV mirrors 22, 23, 24. The EUV mirror 24 is embodied as a grazing incidence mirror.

An illumination angle distribution of the illumination of the object field 5 by the illumination optical unit 4 emerges from the sequence of the individual illumination angles predetermined by the illumination channels of individual facets pairs 25, 28 via the scanning integration of all illumination channels, brought about by a scanning illumination of the facets 25 of the field facet mirror 19 with the aid of the scanning device 36.

In the case of an embodiment of the illumination optical unit 4 (not depicted here), in particular in the case of a suitable position of an entry pupil of the projection optical unit 10, it is also possible to dispense with the mirrors 22, 23 and 24, leading to a corresponding transmission increase of the projection exposure apparatus for the used radiation beam 16.

An overall dose of 49.2 J arrives at the whole object field 5 in each complete scan of the field facet mirror 19. In order to obtain the overall dose in the image field 11, this overall dose still needs to be multiplied by the overall transmission of, firstly, the illumination optical unit 4 and, secondly, the projection optical unit 10. These exemplary specifications assume that a complete scan of the whole field facet mirror 19 is performed during the period of time which a point on the wafer 13 requires to pass through the image field 11. In principle, faster scanning of the illumination light 16 over the field facet mirror 19 is possible. The period of time which a point on the wafer 13 requires to pass through the image field 11 in the case of scanning exposure may be an integer multiple of the period of time required to scan the whole field facet mirror 19 with the illumination light 16.

The reticle 7 reflecting the used radiation beam 16 is arranged in the object plane 6 in the region of the object field 5. The reticle 7 is supported by the reticle holder 8 which can be displaced in an actuated manner via the reticle displacement drive 9.

The projection optical unit 10 images the object field 5 in the image field 11 in the image plane 12. During the projection exposure, the wafer 13 carrying a light-sensitive layer is arranged in this image plane 12, which light-sensitive layer is exposed by the projection exposure apparatus 1 during the projection exposure. The wafer 13 is supported by a wafer holder 14, which in turn can be displaced in a controlled manner via a wafer displacement drive 15.

In order to simplify the representation of positional relationships, an xyz-coordinate system is used below. The x-axis extends perpendicular to the plane of the drawing of FIG. 9 and points into the latter. In FIG. 9, the y-axis extends to the right. In FIG. 9, the z-axis extends downward.

During the projection exposure, both the reticle 7 and the wafer 13 are scanned in a synchronized manner in the y-direction in FIG. 9 by an appropriate actuation of the reticle displacement drive 9 and of the wafer displacement drive 15. The wafer is scanned in the y-direction with a scanning speed of typically 600 mm/s during the projection exposure. The synchronized scanning of the two displacement drives 9, 15 may be performed independently of the scanning operation of the scanning device 36.

The long side of the field facets 25 is perpendicular to a scanning direction y. The x/y-aspect ratio of the field facets 25 corresponds to that of the slit-shaped object field 5, which can likewise be embodied in a rectangular or arcuate form.

Figure 11:
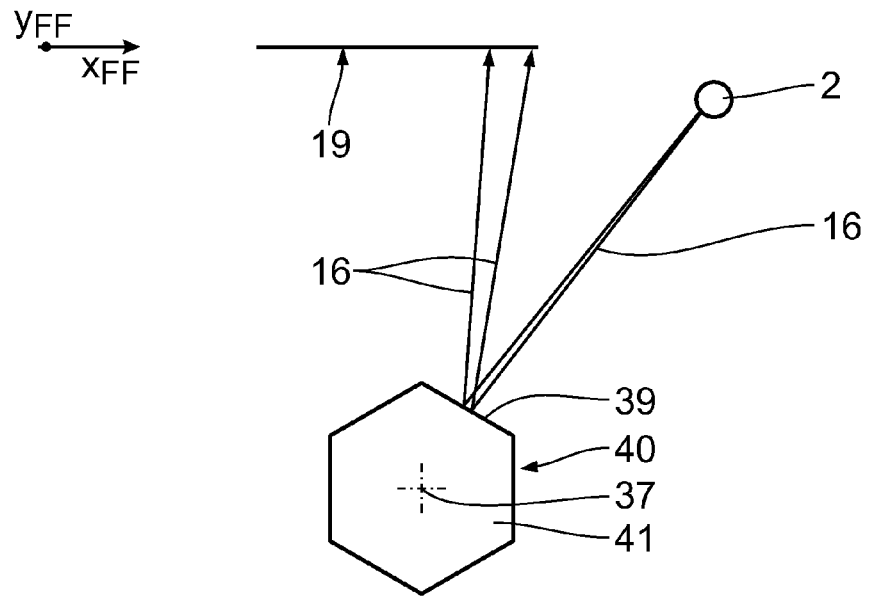
FIG. 11 shows, likewise schematically and in relation to a field facet mirror, a further embodiment of a scanning device for deflecting the EUV output beam from the EUV light source, in a cross section.

FIGS. 10 and 11 show the embodiments of the scanning device 36 for the used radiation beam 16 in more detail. In order to simplify the representation of positional relationships, an x'y'-coordinate system is used for the scanning device in FIG. 10. The x'-axis, which is parallel to the x-axis, extends into the plane of the drawing in FIG. 10. The y'-axis, which lies in the yz-plane, extends obliquely toward the top right in FIG. 10.

In order to represent positional relationships in relation to the field facet mirror 19, an $x_{FF}y_{FF}$-coordinate system is used accordingly. The $x_{FF}$-axis extends parallel to the x-axis, i.e. in the direction of the longer sides of the rectangular field facets 25. The $y_{FF}$-direction extends perpendicular thereto in the direction of the shorter sides of the rectangular field facets 25. In the $x_{FF}$-direction, the field facets 25 have an extent of $X_{FF}$. In the $y_{FF}$-direction, the field facets 25 have an extent of $Y_{FF}$. $X_{FF}/Y_{FF}$ is the x/y-aspect ratio of the field facets 25.

In the embodiment according to FIG. 10, the scanning device 36 is a scanning mirror reflecting the used radiation beam 16 in a grazing manner, which scanning mirror can be tilted about a line scan axis 37, which coincides with the y'-axis, and about a line feed axis 38, which is parallel to the x'-axis. Both axes 37, 38 lie in a reflecting mirror surface 39 of the scanning device 36.

In FIG. 11, the field facet mirror 19 is depicted schematically as a 4×4 array with four horizontal rows, each having four field facets 25. The following frequency and time data relate to the illumination of the field facet mirror 19, already described in conjunction with FIG. 10, with the 6×75 array. In the described embodiment, the tilting about the line scan axis 37 for scanning a field facet line along the $x_{FF}$-direction occurs with a line frequency of 7.5 kHz. Here, the mirror surface 39 is tilted by +/−4.5°, leading to a deflection angle for the used radiation beam 16 of +/−9°. Accordingly, the dwell time of the used radiation beam 16 on respectively one line ($y_{FF}$=const) of the field facet mirror 19 is 133.3 µs. The line feed in the $y_{FF}$-direction is brought about by synchronized tilting about the line feed axis 38 such that the 75 lines are scanned with the correct line distance, wherein the tilting about the line feed axis 38 also ensures a return of the used radiation beam 16 to the first field facet 25a to be scanned from the last scanned field facet 25z. Therefore, the mirror surface 39 is additionally tilted about the line feed axis 38 with a frequency of 100 Hz. The dwell time per individual field facet 25 is 22.2 µs. Thus, 660 EUV radiation pulses are incident on the field facet 25 during the dwell time on one of the field facets 25.

When scanning the field facet mirror 19, the illumination on the field facet mirror 19 can be moved continuously in the y-direction. Such a scanning movement can be achieved with mechanically comparatively simple and durable components.

A higher line frequency than the above-described line frequency of 7.5 kHz is also possible, for example a line frequency of 10 kHz, of 15 kHz, of 20 kHz or else an even higher line frequency.

The distance between the mirror surface 39 and the field facet mirror 19 is approximately 1 m.

Instead of tilting about the line scan axis 37, the line scan can also be generated with the aid of a polygon scanner 40, which rotates around the line scan axis 37. This is depicted schematically in FIG. 11, which shows a plan view of the field facet mirror 19. The $x_{FF}$-axis extends to the right in FIG. 11 and the $y_{FF}$-axis extends perpendicular to the plane of the drawing, toward the observer, in FIG. 11.

For the line scan, the polygon scanner has a polygon mirror 41 with a total of six polygon facets, i.e. it is embodied as a regular hexagon in the circumferential direction around the rotational axis 37 thereof. When the scanning device 36 is embodied with the polygon mirror 41, a tilting mirror is arranged upstream or downstream thereof, which tilting mirror, as described above, can be tilted about the line feed axis 38. Additionally or alternatively, the illumination radiation from the light source 2 can be widened in the y-direction by an optical unit not depicted in FIG. 11. The specified beam diameters then only relate to the x-extent.

When incident on one of the total of six mirror surfaces 39 of the polygon mirror 41, the used radiation beam 16 has a diameter of approximately 5 mm.

A distance between the light source 2 and the polygon mirror 41 is approximately 1 m.

When incident on the field facet mirror 19, i.e. after the reflection on the polygon mirror 41, the used radiation beam 16 has a diameter of approximately 10 mm.

The image field 11 has a slit width parallel to the scanning direction y of 2 mm and a slit width perpendicular to the scanning direction, i.e. in the x-direction, of 26 mm. In the case of an assumed dose of 30 mJ/cm$^2$ on the wafer 13, which ensures that the light-sensitive layer reacts, a scanning speed of 600 mm/s of the reticle 7 and an image field width of 26 mm, the output beam 16 must arrive on the wafer 13 with a power of 5 W.

The respective embodiment of the scanning device 36 is such that in each case continuous scanning regions are scanned on the field facet mirror 19 in sequence, which scanning regions have a scanning region area corresponding at most to the area of the field facets 25. This will be explained in more detail below on the basis of FIG. 12ff. Components and functions which correspond to those which are respectively described with reference to figures already explained above are denoted by the same reference signs and are not discussed in detail again.

On the left-hand side, FIG. 12 schematically shows a top view of a variant of the field facet mirror 19 with arcuate field facets 25. Three columns of field facets 25 and a total of twenty field facets 25 are depicted. Naturally, the number of field facets 25 in the field facet mirror 19 according to FIG. 12 is much greater in reality, as already explained above.

On the right-hand side, FIG. 12 depicts the illumination field 5, on which the field facets 25 of the field facet mirror 19 are imaged in a manner superposing one another.

In the illumination field 5 according to FIG. 12, one field point 42 is highlighted. In FIG. 12, those facet points 43 which are imaged exactly on the field point 42 (original images of the field point 42) via the transmission optical unit 21 are also highlighted. As a result of the spatial relationships of the image of the facet points 43 on the field point 42, the facet points 43 within the respective contour of the field facets 25 do not all lie at exactly the same relative location, but may be slightly displaced with respect to one another, both in the $x_{FF}$-direction and in the $y_{FF}$-direction. This displacement, for which a displacement $\Delta x_{FF}$ for the two upper-most field facets 25 of the left-hand column of the field facet mirror 19 according to FIG. 12 is depicted in an exemplary manner, is small compared to the dimensions of the field facets 25 in the $x_{FF}$-direction and in the $y_{FF}$-direction. Analogous to the displacement $\Delta x_{FF}$, there can also be a displacement $\Delta y_{FF}$ along the $y_{FF}$-direction. This is depicted in FIG. 12 on the basis of the facet points 43 of the two upper-most field facets 25 in the right-hand column. In the $y_{FF}$-direction, these facet points 43 have a distance of $Y_{FF}$ plus $\Delta y_{FF}$ from one another, i.e. are spaced further apart from one another than the extent $Y_{FF}$ of the field facets 25 in the $y_{FF}$-direction by an amount $\Delta y_{FF}$. Depending on the selection of the field point 42 and the respectively associated facet point 43 of a specific field facet 25, a specific value for $\Delta y_{FF}$ emerges for each one of the field facets 25. When considering all the possible combinations of field points 42 and facet points 43 of the field facets 25, a maximum value $\Delta y_{FF,max}$, which $\Delta y_{FF}$ can assume, emerges. This dimension $\Delta y_{FF,max}$ is also referred to as maximum original image displacement of a field point 42 on the facet mirror 25.

In an illustration similar to FIG. 12, FIG. 13 in turn shows the field facet mirror 19 and the illumination field 5. For the field point 42, the facet point 43, which is imaged on the field point 42 via the transmission optical unit 21, is specified for one of the field facets 25, namely the field facet 25 third from bottom in the central column of the field facet mirror 19.

For the other field facets 25, FIG. 13 in each case specifies a facet region 44, which, with reference to the $x_{FF}$-coordinate and $y_{FF}$-coordinate of each individual field facet 25, lies at exactly the same location on the reflection surface of each field facet 25.

The facet region images 45 of these facet regions 44 are not identical, but overlap one another on the illumination field 5 due to the aforementioned geometric deviation when imaging using the transmission optical unit 21 and also due to the slightly different imaging scales of this image resulting therefrom.

The facet region images 45 of the facet regions 44 are depicted on the illumination field 5 on the right-hand side in FIG. 13, which facet region images are generated on the illumination field 5 by the transmission optical unit 21. The field point 42 lies in all facet region images 45. To the extent that the scanning device 36 is actuated in such a way that the facet regions 44 are not illuminated at a given time, the field point 42 can be illuminated by the facet point 43 at the time without this resulting in disturbing interference as a result of illumination of this field point 42 by the other facets 25.

The field point 42 in the right-hand side of FIG. 13 is then only illuminated by one of the facets 25, namely by the facet 25 third from bottom in the central column of the field facet mirror 19 in the left-hand side of FIG. 13.

FIG. 14 likewise shows a top view of the field facet mirror 19. FIG. 14 depicts a variant of an actuation of the scanning device 36, in which a continuous scanning region 46 on the field facet mirror 19 is scanned in sequence, the scanning region area of which continuous scanning region being smaller than the reflection surface of one of the field facets 25. In the actuation variant according to FIG. 14, the scanning region 46 is arcuate like the field facets 25. In the $x_{FF}$-direction, the scanning region 46 has the same extent as the field facets 25. In the $y_{FF}$-direction, the extent of the scanning region 46 is slightly smaller than the extent of the field facets 25. The $y_{FF}$-extent of the field facets 25 is indicated by two dashed delimitation lines 47 in FIG. 14 for comparison purposes. A bounding shape of the scanning region 46 corresponds to the bounding shape of the field facets 25.

A scanning region area S of the scanning region 46 is smaller than the area $F=X_{FF} \times Y_{FF}$ of one of the field facets 25 by at least the ratio of, firstly, the maximum original image displacement $\Delta y_{FF,max}$ of a field point 42, i.e. of an object point of the illumination field 5, on the field facet mirror 19 to, secondly, the facet extent $Y_{FF}$ parallel hereto. Hence, the following applies:

$$S=F \times (1-(\Delta y_{FF,max}/Y_{FF}))$$

In the variant according to FIG. 14, the scanning device 36 is actuated in such a way that the continuous scanning region 46 is always scanned on the field facet mirror 19, wherein this continuous scanning region 46 then is displaced column-by column in the $y_{FF}$-direction over the field facet mirror 19 in accordance with a time profile of the actuation of the scanning device 36.

Thus, two scanning steps are superposed when actuating the scanning device 36. Firstly, an area corresponding to the scanning region 46 is always scanned and this scanning region is secondly scanned column-by-column over the field facets 25 of the field facet mirror 19. At the end of one of the columns of the field facet mirror 19, scanning is continued in the adjacent column.

The selected size of the scanning region 46 leads to no field point on the illumination field 5 being illuminated simultaneously by two different field facets 25. Therefore, disturbing interferences of the illumination light on the illumination field points are precluded.

While the scanning region 46 moves over the facet mirror 19, two adjacent field facets 25 are occasionally impinged upon simultaneously by the illumination light 16, as shown in the snapshot according to FIG. 14. However, since only portions of these two adjacent field facets 25 which cause different regions of the illumination field 5 to be impinged by the illumination light 16 are impinged upon, there nevertheless is no illumination light interference in the illumination field 5.

FIG. 15 shows a further variant of an actuation of the scanning device 36 for sequential illumination of the whole field facet mirror 19. Components and functions corresponding to those already explained above with reference to the other figures are denoted by the same reference signs and are not discussed in detail again.

In the embodiment according to FIG. 15, the scanning region 46 is rectangular. An area of the scanning region 46 is smaller than the area of one of the field facets 25. The $y_{FF}$-extent of the scanning region 46 according to FIG. 15 is once again slightly smaller than the $y_{FF}$-extent of the field facets 25, as already explained in conjunction with FIG. 14. Therefore, the bounding shape of the scanning region 46 does not correspond to the bounding shape of the field facets 25 in the embodiment according to FIG. 15.

The scanning region 46 can not necessarily be written in one of the field facets 25.

Two further examples of the scanning region configuration are explained on the basis of FIGS. 16 and 17, via which respectively one field point in the illumination field 5 is only illuminated by in each case at most one of the facets 25 of the field facet mirror 19. Components and functions corresponding to those which were already explained above with reference to the other figures are denoted by the same reference signs and will not once again be discussed in detail.

In the embodiments according to FIGS. 16 and 17, the scanning device 36 for illuminating the field facet mirror 19 is embodied in such a way that a scanning region 48 extends over a plurality of the facets 25.

In the variant according to FIG. 16, the scanning region 48 is embodied continuously in the form of a scanning range strip extending over three facet columns. This scanning region strip extends obliquely over all three facet columns in the embodiment according to FIG. 16. The gradient of this oblique profile must be so large that a $y_{FF}$-offset between adjacent, illuminated facet columns is greater than a $y_{FF}$-extent of the scanning region 48. The offset is indicated by a dashed line 49 in FIG. 16 and the $y_{FF}$-extent of the scanning region 48 is indicated by a further dashed line 50 in FIG. 16. A difference $\Delta y$ in the $y_{FF}$-direction between the offset 49 and the $y_{FF}$-extent 50 of the scanning region 48 is greater than the maximum original image displacement $\Delta y_{FF,max}$, which was already explained above in conjunction with FIG. 12. At the same time, the profile of the scanning region 48 according to FIG. 16 must be such that an overall $y_{FF}$-extent A of the scanning region 48 is at most as large as the $y_{FF}$-extent $Y_{FF}$ of the individual field facets 25. Here, the difference between the $y_{FF}$-extents A of and $Y_{FF}$ is, in turn, at least as large as the maximum original image displacement $\Delta y_{FF,max}$. By observing these boundary conditions, what is ensured is that respectively one field point in the illumination field 5 is only illuminated by in each case at most one of the field facets 25, even in the case of an actuation leading to a scanning region 48 according to FIG. 16.

When illuminating the field facet mirror 19, the scanning region 48 is scanned in the $y_{FF}$-direction over the field facet mirror 19 in such a way that each one of the field facets 25 is illuminated within one scanning period.

In the actuation variant according to FIG. 17, a plurality of scanning regions 48a, 48b, 48c, the $x_{FF}$-extent of each respectively corresponding to one field facet column width, are scanned in the y-direction over the various columns of the field facet mirror 19. In the $y_{FF}$-direction, the scanning regions 48a, 48b and 48c respectively have a $y_{FF}$-offset from one another which is greater than 0. A y-offset between the scanning regions 48a, 48b and 48c may be greater than a y-extent of the respective scanning region 48a to 48c, plus the maximum original image displacement $\Delta y_{FF,max}$. Once again, an overall extent A of the scanning region 48, formed from the portions 48a to 48c, according to FIG. 17 is at most the $y_{FF}$-extent of the individual field facets 25. Here, once again, the difference between the overall extent A and the $y_{FF}$-extent of the individual field facets 25 can lie in the order of magnitude of the maximum original image displacement $\Delta y_{FF,max}$.

An offset of the scanning region 48 between two column-by-column adjacent field facets 25 is at least the sum of the $y_{FF}$-extent of the scanning region 48 and the maximum original image displacement $\Delta y_{FF,max}$ which was already explained above in conjunction with FIG. 12.

If the area of the scanning region 46 or 48 is small, the area of the simultaneously illuminated region of the illumination field 5 is also small. The overall duration, during which a point of the wafer 13 is impinged upon by used light 16, also depends on the ratio of the overall size of the illumination field 5 to the size of the simultaneously illuminated region of the illumination field, in addition to the size of the image field 11 and the scanning speed of the wafer controlled by the wafer displacement drive 15. As the length of this overall duration increases, the smaller the effect, which spatially and temporally localized interferences may have, becomes.

The area of the scanning region 46 or 48 can be as large as possible, without, however, breaking the previously described conditions on the embodiment of the scanning region in the process. The scanning region 46 or 48 can be selected in such a way that the area thereof is greater than 20% of a reflection surface of one of the field facets. The area of the scanning region 46 or 48 can be greater than a third of the area of one of the field facets 25, can be greater than half of the area of one of the field facets 25, greater than 75% of the area of one of the field facets 25 or can be greater than 90% of the area of one of the field facets 25.

In an embodiment of a projection exposure apparatus, not depicted in a drawing, all travel time differences along pairs of illumination channels $27_i$, which belong to field facets 25 within the same row of the field facet mirror 19, are longer than the coherence time of the illumination light 16. However, the travel time differences along pairs of illumination channels $27_i$, which belong to field facets 25 within different rows of the field facet mirror 19, may be shorter than the coherence time of the illumination light 16. The scanning region 46 has a y-extent as described in conjunction with FIGS. 14 and 15. The x-extent comprises the whole field facet mirror, and so the area of the scanning region 46 now is greater than the area of one field facet 25.

In the following text, a further embodiment of a microlithographic projection exposure apparatus is explained. Components and functions which were already explained above are denoted by the same reference signs and are only mentioned in the following text where this is required for the understanding of deviating components or functions.

In the further embodiment according to FIG. 18, the microlithographic projection exposure apparatus 1 likewise serves for producing a microstructured or nanostructured electronic semiconductor component.

The used radiation beam 16 is illuminated within the aperture angle 35, which is adapted to the illumination optical unit 4 of the projection exposure apparatus 1, with the aid of a beam shaping device 51 yet to be described below. The beam shaping device 51 is embodied as an elliptic mirror. Emanating from the light source 2, the used radiation beam 16 has a divergence which is less than 1 mrad. The beam shaping device 51 is arranged in the intermediate focus plane 18 of the illumination optical unit 4. Downstream of the beam shaping device 51, the used radiation beam 16 is initially incident on the field facet mirror 19.

In the embodiment according to FIG. 18, the used radiation beam 16 more particularly has a divergence which is less than 500 μrad and preferably less than 150 μrad. The diameter of the used radiation beam 16 on the beam shaping device 51 is approximately 5 mm. When emerging from the light source 2, the used radiation beam 16 has an almost vanishing diameter, which is less than 1 mm and may also be less than 500 μm or may be less than 250 μm.

The field facet mirror 19 has a field facet array (not depicted in any more detail here). All that is depicted in FIG. 18 in an exemplary manner is merely some of the actually present field facets 25. The field facets 25 are arranged on a main mirror surface of the field facet mirror 19.

The pupil facets 28 are arranged on a main mirror surface of the pupil facet mirror 20.

The pupil facet mirror 20 is arranged in the region of a position of an entry pupil of the projection optical unit 10. The illumination channels for the individual illumination light partial beams lead to the illumination field 5 from the field facets 25.

An illumination angle distribution of the illumination of the object field 5, which is caused by the illumination optical unit 4, emerges from the individual illumination angles, which are predetermined over each facet pair 25, 28, by the integration of all illumination channels caused by an illumination of the facets 25 of the field facet mirror 19 with the aid of the beam shaping device 51.

The entry pupil of the projection optical unit 10 is situated, possibly after imaging by some or all of the mirrors 22, 23 and 24, in the vicinity of the pupil facet mirror 20.

To the extent that individual components of the projection exposure apparatus 1 are described, use is made of a local xy-coordinate system which spans the main reflection surface or main mirror surface of this component. The x-directions of the global coordinate system and of the local coordinate systems generally coincide or are parallel to one another.

The beam shaping device 51 is an elliptically shaped mirror, on which the used radiation beam 16 is incident in a grazing manner. The distance between the light source 2 and the beam shaping device 51 is e.g. 25 m, 50 m or else 100 m. In particular, the distance can depend on the divergence of the light source 2. As a result of this, a spot with a dimension of e.g. 5 mm results on the beam shaping unit 51.

The elliptically shaped mirror of the beam shaping unit 51 leads to imaging of a beam guidance object plane, which is not depicted in any more detail in the drawing, in a beam guidance image plane. The beam guidance image plane substantially corresponds to the field facet mirror 19. As a result of the small divergence of the used radiation beam 16 from the light source 2, the exact position of the beam guidance object plane is irrelevant and, in the beam guidance object plane, the used light 16 forms a spot with a dimension which only deviates insubstantially from the spot dimension on the beam shaping unit 51. The elliptically shaped mirror from the beam shaping device 51 leads to optical imaging with the imaging scale $|\beta|=60$, and so the used radiation beam 16 illuminates the whole field facet mirror 19.

The distance between the beam shaping unit 51 and the field facet mirror 19 is approximately 2 m.

FIG. 19 schematically shows the main components of the projection exposure apparatus 1. Initially, the light source 2 is imaged in the intermediate focus plane 18 by the collector 17, which is not depicted in FIG. 18. In the case of a light source 2 with a small etendue, in particular in the case of an electron beam-based light source 2 such as e.g. an FEL laser, it is also possible to dispense with the collector 17. The pupil facet mirror 20 with the pupil facets 28 is arranged in such a way that images of the light source 2 come to rest at the location of the pupil facets 28. Therefore, an image of the light source 2 lies in the region of each illuminated pupil facet 28. The pupil facet mirror 20, possibly together with further components of the transmission optical unit 21 (cf. FIG. 18), images the field facets 25 of the field facet mirror 19 in the illumination field or object field 5 in a manner superposed on one another. The optical path length of all rays of the illumination light 16 incident on a specific pupil facet 28 is constant at the location of this pupil facet 28, i.e. the optical path length does not depend on which ray of the illumination light 16, which has reached this pupil facet 28, is considered.

In the following text, a field profile of an optical path length opd (optical path distance) between pupil facets 28 of the pupil facet mirror 20 and the reticle 7 is discussed on the basis of FIGS. 20 and 21. To this end, three pupil facets $28_1$, $28_2$ and $28_3$ of the pupil facet mirror 20, which all three lie in the same xz-plane, are singled out in an exemplary manner. Adjacent ones of these three pupil facets $28_1$ to $28_3$ have a distance of 125 mm from one another. In the z-direction, the pupil facet mirror 20 is a distance of 1500 mm from the reticle 7. A portion of the reticle 7, considered in FIG. 20, has an extent of 104 mm in the x-direction. The central one of the three considered pupil facets, i.e. the pupil facet $28_2$, lies level with the center of the reticle 7 (x=0) in the x-direction.

The diagram according to FIG. 21 highlights dependence of an optical path length between the pupil facets $28_1$ to $28_3$ on the x-coordinate of the reticle 7. The pupil facet $28_3$, depicted all the way on the right in FIG. 20, has the greatest distance from the left-hand edge of the reticle 7 (x=−52 mm), which distance continuously reduces toward the right-hand edge of the reticle 7 (x=+52 mm). This is depicted by a path length curve 52 in FIG. 21. A correspondingly mirrored path length curve 53 emerges for the pupil facet $28_1$ depicted on the left-hand side in FIG. 20. For the third pupil facet $28_2$, arranged centrally over the reticle 7, the path length curve 54 emerges, which has the smallest distance to the center of the reticle 7 (x=0), the distance continuously increasing to the two edges of the reticle 7 (x=+/−52 mm).

The two outer pupil facets $28_1$ and $28_3$ have exactly the same distance from the center of the reticle 7 (x=0). There, the two path length curves 52 and 53 intersect. To the extent that, proceeding from the light source 2, the illumination channels for the respective illumination light partial beams, which have led to the pupil facets $28_1$ and $28_3$, have the same length to the pupil facets $28_1$ and $28_3$ from the light source 2, disturbing interference follows from the following path length equality for x=0, which is avoided by an appropriate arrangement of the pupil facet mirror 20, as will be explained below.

In an illustration similar to FIG. 20, FIG. 22 shows the pupil facet mirror 20, which is now arranged with such a tilt that the normal N thereof with respect to a main mirror surface 55 of the pupil facet mirror 20 is tilted by a tilt angle $\alpha=10°$ with respect to the yz-plane, i.e. with respect to a plane of incidence of the illumination light partial beam on a main mirror surface 56 of the field facet mirror 19. This tilt leads to those partial beams extending in the yz-plane up to the pupil facet mirror 20 subsequently being deflected out of the yz-plane in accordance with this tilt angle.

Figure 26:
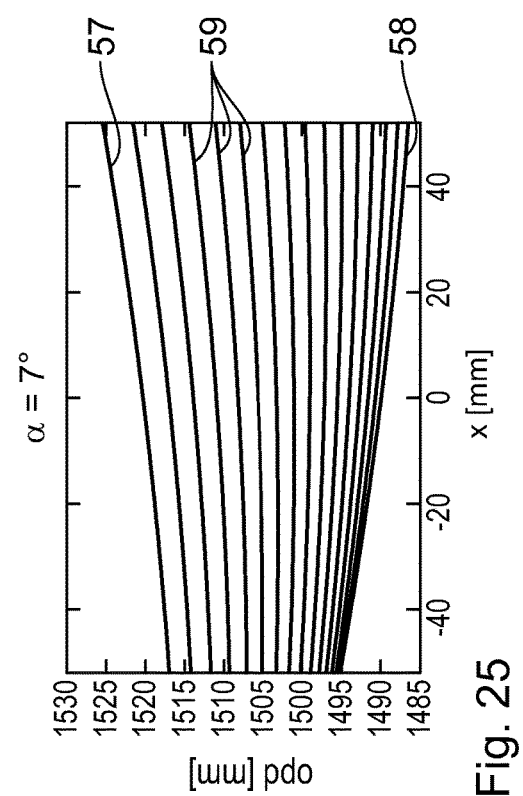

FIG. 26 shows the field profile of the path lengths in relation to the reticle 7 in an illustration corresponding to FIG. 21 for this tilt angle of 10° of the pupil facet mirror 20, for both the pupil facets 28$_1$ and 28$_3$ and for fourteen further pupil facets 28 arranged equidistantly between these two pupil facets 28$_1$, 28$_3$. The pupil facet 28$_1$ always has the greatest distance from the reticle 7, which is depicted by the uppermost path length curve 57 in FIG. 26. The pupil facet 28$_3$ always has the smallest distance from the reticle 7 over the whole x-dimension thereof, which is depicted by the lowermost path length curve 58 in FIG. 26. The fourteen pupil facets 28 lying therebetween have field profiles which are depicted by path length curves 59 lying between the path length curves 57, 58. In the case of the tilt angle $\alpha=10°$, these path length curves 57 to 59 do not intersect over the whole x-dimension of the reticle 7. Therefore, situations enabling unwanted interference, as described above in conjunction with FIG. 21, do not occur. Thus, tilting the pupil facet mirror 20 in accordance with FIG. 22 leads to the various illumination channels, via which each of the field points of the illumination field 5 can be impinged upon by the partial beams of the illumination light 16, in each case having different channel lengths between the light source 2 and respectively one of the field points, i.e. respectively one of the points on the reticle 7 when the reticle is arranged for projection exposure.

Figure 23:
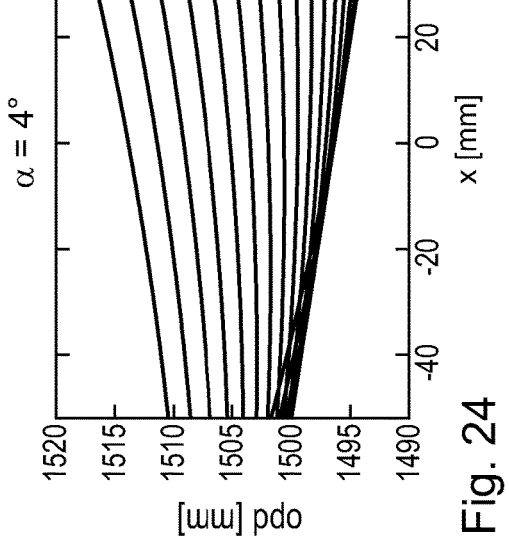
Figure 24:
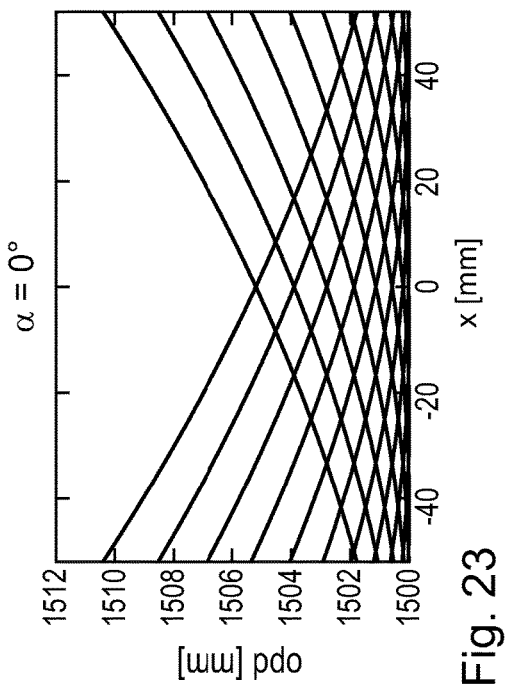
Figure 25:
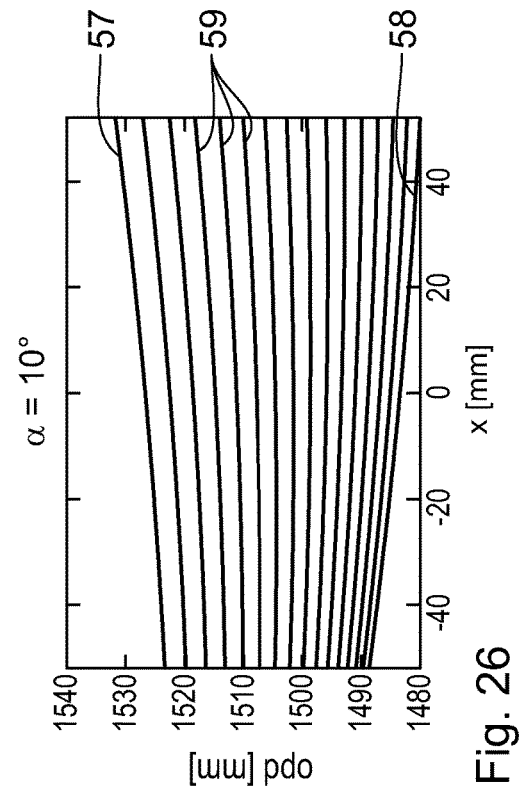

In accordance with FIG. 26, FIGS. 23 to 25 show the path length dependencies for the sixteen pupil facets discussed above in conjunction with FIGS. 22 and 26 on the x-dimension of the reticle 7. In the case of a tilt angle $\alpha=7°$, the path length curves 57 to 59 likewise do not intersect, and so an arrangement of the pupil facet mirror 20 avoiding disturbing interference is also present here. In the case of a tilt angle $\alpha$ of 4°, the path length curves 58 and 59 intersect for those pupil facets 28 in the region of the pupil facet 28$_3$ depicted outside right in FIGS. 20 and 22. FIG. 23 shows the situation in the case of a non-tilted pupil facet mirror 20 ($\alpha=0°$), which corresponds to the situation according to FIGS. 20 and 21.

A further measure, which can be used alternatively or additionally, of arranging the pupil facet mirror 20 in such a way that there is no unwanted identical optical path length opd of the illumination channels for the illumination light partial beams lies in the provision of a defined curvature of the main mirror surface 55 of the pupil facet mirror 20. This measure will be explained below on the basis of FIGS. 19, 27 and 28. In this variant, a curved main mirror surface 55' is present, which is indicated by a dash-dotted line in FIG. 19. FIG. 27 shows, with a magnified scale, a curvature profile 60 of the main mirror surface 55' of the pupil facet mirror 20 in the xz-plane (y=constant). Here, the left-hand scale in the diagram in FIG. 27 applies. At the same time, the diagram in FIG. 27 shows a curvature profile 61 of the curved main mirror surface 55' with a scale which is identical for the horizontal (x) and vertical (z) axes. In this case, the right-hand scale of the diagram in FIG. 27 applies.

The main mirror surface 55' has a parabolic curvature profile.

FIG. 28 shows the dependence of the optical path length opd for fifteen pupil facets 28, aligned equidistantly between the positions of the pupil facets 28$_1$ and 28$_3$ of the arrangement according to FIG. 20, emerging from this curved profile of the main mirror surface 55', i.e. the field profile (profile curves 62) of the optical path lengths of these fifteen pupil facets 28.

The main mirror surface 55' has such a curvature that the fifteen pupil facets 28 practically have the same distance from the left-hand edge of the reticle 7 (x=−52 mm). A small difference in the distance, which is too small to be able to be identified in the figure, is also present here and prevents disturbing equality of the optical path lengths to the left-hand edge of the reticle 7. The profile curves 62 do not intersect between x=−52 and x=+52 mm, i.e. over the whole used region of the reticle 7. Thus, what emerges here is a situation in which disturbing equality of the optical path lengths from the various pupil facets 28 to specific points on the reticle 7 is also avoided once again.

Thus, the main mirror surface 55' of the pupil facet mirror 20 deviates from a flat surface (reference surface 55) in such a way that the various illumination channels, via which each of the field points of the illumination field 5 can be impinged upon by partial beams of illumination light 16, in each case have different channel lengths between the light source 2 and respectively one of the field points of the illumination field 5.

A further embodiment for avoiding disturbing interferences between illumination light partial beams guided over various illumination channels to the illumination field 11 is explained below on the basis of FIGS. 29 to 31. These show, with great magnification, respectively one of the field facets 25, this time with an arcuate or partial ring-shaped embodiment. A different scale is used for the horizontal axis and for the vertical axis in the drawing. The y-extent of the field facet 25 is one tenth of the x-extent thereof.

The field facet 25 according to FIG. 29 is optimized for an operation of the projection exposure apparatus 1 with an illumination setting, i.e. a distribution of the illumination angles with which the object field points are illuminated, having the "y-dipole" configuration. In this "y-dipole" illumination setting, the illumination or object field 5 is illuminated from the direction of two illumination light poles spaced apart from one another in the y-direction. In this illumination setting, there is an intensity distribution in a pupil plane of the illumination optical unit 4 or 26 in the form of two intensity poles spaced apart from one another in the y-direction. Examples of such and further illumination settings are discussed in DE 10 2008 021 833 B4.

The field facet 25 according to FIG. 29 carries blocking regions 63 on the reflection surface 64 thereof. The blocking regions 63 are embodied in a line-shaped manner. The blocking regions 63 block illumination light 16 incident on the reflection surface 64 of the field facet 25 such that the illumination light does not contribute to the illumination of the illumination field 5.

The blocking regions 63, perpendicular to the longitudinal extent thereof, have a very small extent in the region of e.g. 100 μm or even less. The blocking regions 63 have been applied to the field facet 25 where illumination light, which is guided through the illumination channel to which this field facet 25 belongs, for a specific object field point via this field facet 25 would have disturbing interference with illumination light from a further illumination channel to which a different field facet 25 belongs. Perpendicular to the respective longitudinal extent of the blocking regions 63, these have an extent which, for example, is at most 1 mm and is regularly significantly smaller, e.g. 800 μm, 700 μm, 600 μm, 500 μm, 400 μm or may be even smaller still. An extent of the blocking regions 63 perpendicular to the direction of extent thereof which is greater than 1 mm is also possible.

Hence, all blocking regions 63 of a field facet 25 together block less than 10% of the overall reflection surface 64 of this field facet 25.

The blocking regions 63 block a corresponding portion of the cross section of the illumination light partial beam 16, incident on the field facet 25.

Thus, what the blocking regions 63 bring about is that a cross-sectional region of at least one of the illumination channels of an illumination channel pair does not, due to the blocking regions 63, contribute to illuminating the illumination field 5 in the case of illumination channel pairs in which, during operation of the illumination optical unit 4 or 26, the corresponding pair of illumination light partial beams 16, which are guided via the illumination channels of the illumination channel pair, have a travel time difference, as calculated from the source, at any time which is shorter than the coherence duration $\tau_K$ of the illumination light 16 at any respectively considered point of the illumination field 5. Therefore, disturbing interference components are suppressed by the blocking regions 63.

In the case of field facets 25, appropriately equipped with such blocking regions 63, of the whole field facet mirror 19, an individual pattern of blocking regions 63 emerges on the reflection surface 64 for each of the field facets 25, depending on the arrangement thereof on the field facet mirror 19, depending on the geometry of the illumination optical unit 4 and depending on the illumination setting. By way of example, this individual pattern can be calculated by a ray tracing program. Depending on the result of this calculation, the pattern can then be applied to the reflection surfaces 64 of the field facets 25, for example by an appropriate coating.

An integral light loss due to the blocking regions 63, i.e. a throughput loss for the illumination light 16, is less than 10% and may lie in the region of 2%.

In principle, the field facet mirror 25 may also be built up from a plurality of individual micromirrors 65. A corresponding row-by-row and column-by-column array structure of such micromirrors 65 is indicated in FIG. 29 in sections. In such an alternative micromirror configuration, micromirrors 65, which are tilted in such a way that illumination light 16 impinging thereon does not contribute to the illumination of the object field 5, are present instead of the blocking regions 63.

The micromirrors 65 are components of a MEMS array arrangement. By way of example, a corresponding MEMS array arrangement is known to a person skilled in the art from e.g. WO 2009/100 856 A1. The micromirrors 65 can be tilted independently of one another by at least two tilt degrees of freedom such that a reflecting guide of the illumination light partial beam 16 incident on such a micromirror field facet 25 can be predefined by the tilt position of the micromirrors 65.

FIG. 30 shows a further field facet 25 in an illustration similar to FIG. 29. The field facet 25 according to FIG. 30 likewise carries blocking regions 63. In the field facet 25 according to FIG. 30, the arrangement of the blocking regions 63 is optimized for an "x-dipole" illumination setting. This arrangement of the blocking regions 63 differs qualitatively and quantitatively from the one according to FIG. 29.

FIG. 31 shows a further embodiment of a field facet 25, once again in an illustration corresponding to the one according to FIGS. 29 and 30.

In the case of the field facet 25 according to FIG. 31, blocking regions 63 have been applied for a plurality of different illumination settings that can be used in a projection exposure apparatus 1. These include the "y-dipole" and "x-dipole" illumination settings, and so all blocking regions 63 in FIGS. 29 and 30 are also present in the field facet 25 according to FIG. 31.

In the case of a micromirror embodiment of the field facet 25, the various blocking region configurations according to FIGS. 29 to 31 can be set by appropriate tilt actuations of the micromirrors 65.

A further embodiment of an illumination optical unit 4 for avoiding disturbing interferences of the illumination light partial beams 16, in the object field 5 is described on the basis of FIGS. 32 to 34. Components and functions corresponding to those which were already explained above with reference to FIGS. 1 to 31 are denoted by the same reference signs and will not once again be discussed in detail.

The field facet mirror 19 according to FIGS. 32 to 34 once again has arcuate field facets 25, which are arranged next one another in four columns $25_I$, $25_{II}$, $25_{III}$ and $25_{IV}$.

The field facet mirror 19 simultaneously constitutes the optical retardation component 29 or 33 of the illumination optical unit 4.

The facet columns $25_I$ to $25_{IV}$ are arranged offset to one another in the z-direction in relation to a main reflection plane 66 of the field facet mirror, i.e. perpendicular to the main reflection plane 66. Here, as indicated in FIG. 33, the offset of adjacent facet columns $25_I$ to $25_{IV}$ is $\Delta l/2$, i.e. it is at least half the coherence duration $\tau_K$. What was already explained above, in particular in conjunction with the embodiment according to FIG. 4, applies to this path length difference. Alternatively, a step distance between the field facet columns $25_I$ to $25_{IV}$ may also be $\delta l/2$. In this case, what was already explained above in conjunction with the embodiment according to FIG. 7 applies here.

The field facet mirror is simultaneously illuminated by the illumination light 16 from the EUV light source 2 via a scanning region 67, as was explained above, for example in conjunction with the scanning regions 46 and 48 of the embodiments according to FIGS. 14 to 17. In the x-direction, the scanning region 67 has an extent corresponding to the x-extent of the whole field facet mirror 19. In the y-direction, the scanning region 67 has an extent corresponding to the y-extent of respectively one of the field facets 25.

What the stepped arrangement of the facet columns $25_I$ to $25_{IV}$ ensures is that illumination light partial beams $16_i$, which are guided to different field facet columns $25_I$ to $25_{IV}$, do not have disturbing interference.

FIG. 34 shows, in an exemplary manner, an assignment of four illumination channels 27 to the field facets 25, respectively the top ones in FIG. 34, of the four facet columns $25_I$ to $25_{IV}$. In the very schematic illustration according to FIG. 34, the field facet mirror 19 and the pupil facet mirror 20 are respectively depicted in a top view. FIG. 34 only shows those pupil facets 28 of the pupil facet mirror 20 which belong to the four illumination channels 27 shown in an exemplary manner. The tilt angles of the field facets assigned to these four illumination channels 27 are such that a point-symmetric arrangement of pupil facets 28 is illuminated in the region of the arrangement plane of the pupil facet mirror 20. There moreover is such an assignment of the pupil facets 28 to the field facets 25 that the pupil facets 28, assigned to the field facets 25 of one of the field facet columns $25_I$ to $25_{IV}$ via respective illumination channels 27, are arranged symmetrically and uniformly distributed in the arrangement plane of the pupil facet mirror 20 in accordance with the respectively desired illumination setting. An unwanted negative influence of illumination parameters, in particular on a telecentricity and an ellipticity of the illumination, due to the z-offset of the field facet columns $25_I$ to $25_{IV}$ can then be reduced or completely avoided. Definitions of these telecentricity and ellipticity illumination parameters can be found in U.S. Pat. No. 8,174,677.

The arrangement example of the illumination channels 27 according to FIG. 34 belongs to an annular illumination setting or a quadrupole illumination setting.

Due to the larger scanning region 67 compared to the embodiments according to FIGS. 14 to 17, this results in a higher throughput of the illumination optical unit 4. Moreover, effects of light source variations on illumination variables can be reduced.

The invention claimed is:

1. An illumination optical unit configured to guide illumination light to an illumination field, the illumination optical unit comprising:
   a first facet mirror comprising a plurality of first facets configured to guide the illumination light to the illumination field,
   wherein during operation of the illumination optical unit:
      the illumination light comprises a plurality of illumination light partial beams;
      each illumination light partial beam is guided by a respective illumination channel;
      each illumination channel is guided by a respective first facet;
      no more than one illumination channel is guided by a given first facet;
      the plurality of illumination light partial beams comprises a first illumination light partial beam and a second illumination light partial beam which is different from the first illumination light partial beam;
      the first illumination light partial beam is guided to the illumination field by a first illumination light channel;
      the second illumination light partial beam is guided to the illumination field by a second illumination light channel which is different from the first illumination light channel;
      the first and second illumination light partial beams are incident simultaneously at the same point in the illumination field;
      the first illumination light partial beam has a first travel time to the illumination field;
      the second illumination light partial beam has a second travel time to the illumination field;
      a difference between the first and second travel times is greater than a coherence duration of the illumination light; and
      the illumination optical unit is an EUV illumination optical unit.

2. The illumination optical unit of claim 1, further comprising a second facet mirror downstream of the first facet mirror in a beam path of the illumination light through the illumination optical unit, the second facet mirror comprising a plurality of second facets,
   wherein during operation of the illumination optical unit:
      each illumination channel is guided by a respective second facet;
      no more than one illumination channel is guided by a given second facet.

3. The illumination optical unit of claim 2, wherein:
the first facet mirror is a field facet mirror;
the first facets are field facets;
the second facet mirror is as pupil facet mirror;
the second facets are pupil facets;
the illumination optical unit comprises a transmission optical unit configured to superimpose imaging of the field facets in the illumination field; and
the transmission optical unit comprises the pupil facet mirror;
the illumination optical unit is arrangeable so that images of the illumination light source come to rest at the location of the pupil facets;
the pupil facet mirror is configured with a tilt so that the various illumination channels, by which each one of the field points of the illumination field is impinged upon by the illumination light partial beams during operation of the illumination optical unit, respectively have different illumination channel lengths between the light source and respectively one of the field points of the illumination field.

4. The illumination optical unit of claim 2, wherein:
the first facet mirror is a field facet mirror;
the first facets are field facets;
the second facet mirror is embodied as pupil facet mirror;
the second facets are pupil facets;
the illumination optical unit comprises a transmission optical unit configured to superimpose imaging of the field facets in the illumination field;
the transmission optical unit comprises the pupil facet mirror;
the illumination optical unit is arrangeable so that images of the illumination light source come to rest at the location of the pupil facets;
a main mirror surface of the pupil facet mirror deviates from a plane reference surface so that the various illumination channels, by which each one of the field points of the illumination field are impinged upon by the illumination light partial during operation of the illumination optical unit, respectively have different illumination channel lengths between the light source and respectively one of the field points of the illumination field.

5. The illumination optical unit of claim 2, wherein the illumination optical unit is configured so that during operation of the illumination optical unit:
   travel time differences exist between the illumination light partial beams depending on differences in path lengths of beam paths of the illumination channels; and
   between a location in the beam path of the illumination light prior to the division of the illumination light into the illumination light partial beams and the illumination field, each difference between the travel times of two different illumination light partial beams is always greater than a coherence duration of the illumination light for each location in the illumination field.

6. The illumination optical unit of claim 2, further comprising an optical retardation component configured to divide at least one illumination light partial beam into a plurality of partial beam components,
   wherein:
      between a first location in the beam path of the illumination light and the illumination field, the partial beam components have such pairwise travel time differences amongst themselves that each difference between the travel times of the partial beam components of any illumination light partial beams is greater than the coherence duration of the illumination light; and
      the first location lies both upstream of the division of the illumination light into the illumination light partial beams and upstream of the retardation component the partial beam components.

7. The illumination optical unit of claim 2, further comprising a scanning device configured to scan an illumination beam over the first facets so that that the illumination light illuminates the illumination field during operation of the illumination optical unit,
wherein:
when incident on the first facet mirror, an entire beam crosssection of the illumination beam is greater than 20% of a reflection surface of one of the first facets; and
the scanning device is configured so that at any given time a given field point in the illumination field is illuminated via at most one of the first facets.

8. The illumination optical unit of claim 7, wherein the scanning device is configured so that a scanning region extending over a plurality of first facets is scanned on the facet mirror during operation of the illumination optical unit.

9. The illumination optical unit of claim 2, further comprising a scanning device configured to scan an illumination beam over the first facets so that the illumination light illuminates the illumination field during operation of the illumination optical unit,
wherein:
when incident on the first facet mirror, an entire beam crosssection of the illumination beam is greater than 200% of a reflection surface of one of the first facets; and
the scanning device is configured so that at any given time a given field point in the illumination field is illuminated only via first facets in which the optical path length difference of their corresponding illumination chancels differs by at least one coherence length.

10. The illumination optical unit of claim 2, wherein the illumination optical unit is configured so that during operation of the illumination optical unit:
illumination channel pairs exist in which illumination light guided along the illumination channel pairs is incident at at least one point of the illumination field so that the time difference is less than a coherence duration of the illumination light; and
a cross-sectional area of at least one of the illumination channels of the illumination channel pairs does not contribute to illuminating the illumination field.

11. The illumination optical unit of claim 1, wherein the illumination optical unit is configured so that during operation of the illumination optical unit:
travel time differences exist between the illumination light partial beams depending on differences in path lengths of beam paths of the illumination channels; and
between a location in the beam path of the illumination light prior to the division of the illumination light into the illumination light partial beams and the illumination field, each difference between the travel times of two different illumination light partial beams is always greater than a coherence duration of the illumination light for each location in the illumination field.

12. The illumination optical unit of claim 1, further comprising an optical retardation component configured to divide at least one illumination light partial beam into a plurality of partial beam components,
wherein:
between a first location in the beam path of the illumination light and the illumination field, the partial beam components have such pairwise travel time differences amongst themselves that each difference between the travel times of the partial beam components of any illumination light partial beams is greater than the coherence duration of the illumination light; and
the first location lies both upstream of the division of the illumination light into the illumination light partial beams and upstream of the retardation component the partial beam components.

13. The illumination optical unit of claim 1, further comprising a scanning device configured to scan an illumination beam over the first facets so that that the illumination light illuminates the illumination field during operation of the illumination optical unit,
wherein:
when incident on the first facet mirror, an entire beam crosssection of the illumination beam is greater than 20% of a reflection surface of one of the first facets; and
the scanning device is configured so that at any given time a given field point in the illumination field is illuminated via at most one of the first facets.

14. The illumination optical unit of claim 13, wherein the scanning device is configured so that a scanning region extending over a plurality of first facets is scanned on the facet mirror during operation of the illumination optical unit.

15. The illumination optical unit of claim 1, further comprising a scanning device configured to scan an illumination beam over the first facets so that the illumination light illuminates the illumination field during operation of the illumination optical unit,
wherein:
when incident on the first facet mirror, an entire beam crosssection of the illumination beam is greater than 200% of a reflection surface of one of the first facets; and
the scanning device is configured so that at any given time a given field point in the illumination field is illuminated only via first facets in which the optical path length difference of their corresponding illumination chancels differs by at least one coherence length.

16. The illumination optical unit of claim 1, wherein the illumination optical unit is configured so that during operation of the illumination optical unit:
illumination channel pairs exist in which illumination light guided along the illumination channel pairs is incident at at least one point of the illumination field so that the time difference is less than a coherence duration of the illumination light; and
a cross-sectional area of at least one of the illumination channels of the illumination channel pairs does not contribute to illuminating the illumination field.

17. An optical system, comprising:
an EUV light source; and
an illumination optical unit according to claim 1.

18. An apparatus, comprising:
an EUV light source;
an illumination optical unit according to claim 1; and
a projection optical unit configured to image an object field, which is arranged in the illumination field, into an image field,
wherein the apparatus is a projection exposure apparatus.

19. The apparatus of claim 18, further comprising a second facet mirror downstream of the first facet mirror in a beam path of the illumination light through the illumination optical unit, the second facet mirror comprising a plurality of second facets,
  wherein during operation of the illumination optical unit:
    each illumination channel is guided by a respective second facet;
    no more than one illumination channel is guided by a given second facet.

20. A method of using a projection exposure apparatus comprising an illumination optical unit and a projection optical unit, the method comprising:
  using the illumination optical unit to illuminate a lithography mask; and
  using the projection optical unit to image at least part of the mask onto a light-sensitive layer,
  wherein the illumination optical unit is an illumination optical unit according to claim 1.

* * * * *

UNITED STATES PATENT AND TRADEMARK OFFICE
CERTIFICATE OF CORRECTION

| | | |
|---|---|---|
| PATENT NO. | : 9,645,501 B2 | Page 1 of 1 |
| APPLICATION NO. | : 14/467418 | |
| DATED | : May 9, 2017 | |
| INVENTOR(S) | : Michael Patra and Markus Deguenther | |

It is certified that error appears in the above-identified patent and that said Letters Patent is hereby corrected as shown below:

In the Claims

Column 35, Line 5, Claim 7, delete "that that" and insert -- that --.

Column 35, Line 34, Claim 9, delete "chancels" and insert -- channels --.

Column 36, Line 13, Claim 13, delete "that that" and insert -- that --.

Column 36, Line 43, Claim 15, delete "chancels" and insert -- channels --.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*